(12) United States Patent
Shinohara et al.

(10) Patent No.: US 11,740,292 B2
(45) Date of Patent: Aug. 29, 2023

(54) BATTERY TYPE IDENTIFYING DEVICE, AND METHOD FOR IDENTIFYING BATTERY TYPE

(71) Applicant: TOYOTA JIDOSHA KABUSHIKI KAISHA, Toyota (JP)

(72) Inventors: Masanori Shinohara, Toyota (JP); Kazuhiko Sakakibara, Toyota (JP); Tomoharu Maeda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 672 days.

(21) Appl. No.: 16/964,378

(22) PCT Filed: Feb. 26, 2019

(86) PCT No.: PCT/JP2019/007382
§ 371 (c)(1),
(2) Date: Jul. 23, 2020

(87) PCT Pub. No.: WO2019/172024
PCT Pub. Date: Sep. 12, 2019

(65) Prior Publication Data
US 2020/0350639 A1  Nov. 5, 2020

(30) Foreign Application Priority Data

Mar. 6, 2018  (JP) .................................. 2018-039674

(51) Int. Cl.
*G01R 31/379* (2019.01)
*H01M 10/48* (2006.01)

(52) U.S. Cl.
CPC .......... *G01R 31/379* (2019.01); *H01M 10/48* (2013.01); *H01M 10/486* (2013.01)

(58) Field of Classification Search
CPC .... G01R 31/379; H01M 10/48; H01M 10/486
See application file for complete search history.

(56) References Cited

U.S. PATENT DOCUMENTS

2016/0248080 A1   8/2016  Kyo
2018/0267107 A1   9/2018  Iida et al.

FOREIGN PATENT DOCUMENTS

| JP | 2015-165219 A | 9/2015 |
| JP | 2016-162728 A | 9/2016 |
| WO | WO 2016/129260 A1 | 8/2016 |

OTHER PUBLICATIONS

International Search Report dated May 7, 2019 in PCT/JP2019/007382 filed Feb. 26, 2019, 1 page.

*Primary Examiner* — Sarah A. Slifka
(74) *Attorney, Agent, or Firm* — Oblon, McClelland, Maier & Neustadt, L.L.P.

(57) ABSTRACT

A battery type identifying device is capable of identifying the type of a vehicle-mounted lead storage battery. The battery type identifying device includes: a charge processing unit which, on the condition that the state of a lead storage battery has reached a prescribed state as a result of a reduction in the amount of electricity stored therein from a fully charged state, carries out a determination charging process of charging the lead storage battery for a prescribed time; an accepted amount acquiring unit which acquires an amount accepted by the lead storage battery in the period during which the determination charging process is being carried out; and a determining unit which determines whether the lead storage battery is a liquid-type lead storage battery on the basis of the accepted amount acquired by the accepted amount acquiring unit.

12 Claims, 10 Drawing Sheets

Fig.16

| Battery Liquid Temperature TMP | TMP<TMP1 | TMP1≦TMP<TMP2 | TMP2≦TMP |
|---|---|---|---|
| Soak Correction Amount α1 | Z1 | Z2 | Z3 |

Fig.17

| Battery Liquid Temperature TMP | TMP<TMP11 | TMP11≦TMP<TMP12 | TMP12≦TMP |
|---|---|---|---|
| Decrease Correction Amount α2 | Z11 | Z12 | Z13 |

Fig.18

| Battery Liquid Temperature TMP | TMP<TMP21 | TMP21≦TMP<TMP22 | TMP22≦TMP |
|---|---|---|---|
| Determination Prohibition Threshold Value ACFdTh | Z21 | Z22 | Z23 |

BATTERY TYPE IDENTIFYING DEVICE, AND METHOD FOR IDENTIFYING BATTERY TYPE

TECHNICAL FIELD

The present invention relates to a battery type identifying device and a method for identifying a battery type.

BACKGROUND ART

Patent Document 1 describes an example of an identification device that identifies whether an onboard lead-acid battery is a liquid-type lead-acid battery or a valve regulated lead-acid battery. In the identification device, an open-circuit voltage of the onboard lead-acid battery is acquired, and a charge-discharge capacity of the lead-acid battery during the acquisition of the open-circuit voltage is acquired. The data indicating the open-circuit voltage and the charge-discharge capacity of the lead-acid battery that have been acquired are plotted on a graph in which one of the vertical axis and the horizontal axis indicates the open-circuit voltage and the other one of the vertical axis and the horizontal axis indicates the charge-discharge capacity of the lead-acid battery. When such plural data are plotted on the graph, the inclination of an approximate straight line based on each of the data is calculated. Using the inclination of the approximate straight line, the type of a lead-acid battery is identified.

PRIOR ART DOCUMENTS

Patent Documents

Patent Document 1: Japanese Laid-Open Patent Publication No. 2015-165219

SUMMARY OF THE INVENTION

Problems that the Invention is to Solve

A vehicle including an idling stop function is equipped with a high-grade one of a liquid-type lead-acid battery or a valve regulated lead-acid battery.

Even if the valve regulated lead-acid battery is used with a relatively small charge amount, stratification is less likely to occur as compared with the liquid-type lead-acid battery. That is, even if the valve regulated lead-acid battery is used with a small charge amount, the valve regulated lead-acid battery is less likely to have a short life. Thus, in the vehicle equipped with the valve regulated lead-acid battery, as compared with the vehicle equipped with the liquid-type lead-acid battery, the vehicle is controlled with a high acceptability of electric charge during charging and with a small charge amount of the lead-acid battery. In contrast, when the liquid-type lead-acid battery is used with a relatively small charge amount, stratification is more likely to occur as compared with the valve regulated lead-acid battery. The stratification causes the life of the liquid-type lead-acid battery to be shortened easily. Thus, in the vehicle equipped with the liquid-type lead-acid battery, as compared with the vehicle equipped with the valve regulated lead-acid battery, the vehicle is controlled with a large charge amount of the lead-acid battery.

Accordingly, in order to execute a suitable vehicle control corresponding to the type of an onboard lead-acid battery even if the lead-acid battery is exchanged, the type of a new lead-acid battery subsequent to the exchange needs to be identified in a suitable manner.

Means for Solving the Problem

A battery type identifying device that solves the above-described problem is a battery type identifying device that identifies a type of an onboard lead-acid battery. A state of the lead-acid battery when a charge amount decreases by a given amount from a fully-charged state is referred to as a given state, and an amount of the charge amount of the lead-acid battery increased through charging is referred to as an acceptance amount. The battery type identifying device includes a charging processor that executes a determination charging process that charges the lead-acid battery during a given time on condition that the state of the lead-acid battery has entered the given state due to a decrease in the charge amount from the fully-charged state, an acceptance amount acquisition unit that acquires the acceptance amount of the lead-acid battery during an execution period of the determination charging process, and a determination unit that determines whether the lead-acid battery is a liquid-type lead-acid battery using the acceptance amount acquired by the acceptance amount acquisition unit.

The valve regulated lead-acid battery and the liquid-type lead-acid battery are different in the acceptability of electric charge when the battery is charged. More specifically, the valve regulated lead-acid battery is inferior to the liquid-type lead-acid battery in the acceptability of electric charge when the battery is charged. Thus, when the lead-acid battery is charged during a certain period of time, the acceptance amount during the charging period in a case where the onboard lead-acid battery is a liquid-type lead-acid battery diverges from the acceptance amount during the charging period in a case where the onboard lead-acid battery is a valve regulated lead-acid battery.

In the above-described configuration, when the state of the lead-acid battery enters the given state due to a decrease in the charge amount from the fully-charged state, the determination charging process is executed. That is, the state of the lead-acid battery when the determination charging process is started is adjusted to the given state. Then, the acceptance amount of the lead-acid battery during the execution period of the determination charging process is acquired. Since the determination charging process is executed after the state adjustment of the lead-acid battery, the acquired acceptance amount corresponds to the type of the lead-acid battery. The acquired acceptance amount is used to determine whether the lead-acid battery is a liquid-type lead-acid battery. Accordingly, the type of the onboard lead-acid battery can be identified.

For example, it is preferred that the determination unit determine that the lead-acid battery is a liquid-type lead-acid battery when the acceptance amount acquired by the acceptance amount acquisition unit is larger than a determination acceptance amount. In this configuration, when the acceptance amount of the lead-acid battery during the execution period of the determination charging process is large, it is determined that the lead-acid battery is a liquid-type lead-acid battery.

When the lead-acid battery having a high internal resistance is referred to as a low-grade lead-acid battery and the lead-acid battery having a low internal resistance is referred to as a high-grade lead-acid battery, the durability for repeated charging and discharging in the low-grade lead-acid battery is lower than the durability for repeated charging and discharging in the high-grade lead-acid battery.

Accordingly, the low-grade lead-acid battery is a lead-acid battery that is not suitable for being mounted on a vehicle having an idling stop function. In contrast, the high-grade lead-acid battery has a lower internal resistance and is thus a lead-acid battery that is suitable for being mounted on a vehicle having an idling stop function.

In a case where the onboard lead-acid battery is a low-grade lead-acid battery, the acceptance amount during the execution period of the determination charging process is not so large when the determination charging process is executed after the state of the lead-acid battery enters the given state due to a decrease in the charge amount from the above-described fully-charged state. That is, it cannot be identified only from the above-described acceptance amount whether the lead-acid battery is a valve regulated high-grade lead-acid battery or a low-grade lead-acid battery.

Thus, it is preferred that the determination unit determine that the lead-acid battery is a valve regulated lead-acid battery when an internal resistance of the lead-acid battery is less than a determination resistance value and the acceptance amount acquired by the acceptance amount acquisition unit is less than or equal to the determination acceptance amount. In this configuration, when the internal resistance of the lead-acid battery is low and the acceptance amount of the lead-acid battery during the execution period of the determination charging process is not large, it is determined that the lead-acid battery is a valve regulated high-grade lead-acid battery. Thus, when the above-described acceptance amount is not large, it can be determined whether the lead-acid battery is a valve regulated high-grade lead-acid battery by also using the internal resistance for identification of the lead-acid battery.

In the above-described battery type identifying device, the charging processor may execute a fully-charging process that charges the lead-acid battery so that the lead-acid battery becomes fully charged when identifying the type of the lead-acid battery, and the determination charging process on condition that the lead-acid battery has entered the given state due to a decrease in the charge amount of the lead-acid battery subsequent to completion of the execution of the fully-charging process. When the charge amount of the lead-acid battery when the charging processor starts the fully-charging process is referred to as an initial capacity, it is preferred that the acceptance amount acquisition unit acquire the initial capacity when the charging processor starts executing the fully-charging process to acquire, in association with the initial capacity, the acceptance amount of the lead-acid battery during a subsequent execution period of the determination charging process executed by the charging processor. Further, when multiple pieces of information including the initial capacity and the acceptance amount associated with the initial capacity are acquired, it is preferred that the determination unit determine whether the lead-acid battery is a liquid-type lead-acid battery according to whether an inclination of an approximate straight line is positive or negative, the approximate straight line indicating association between the initial capacity and the acceptance amount and being calculated using the multiple pieces of information.

In the liquid-type high-grade lead-acid battery, the battery may undergo stratification when charged and discharged. When the liquid-type high-grade lead-acid battery undergoes stratification, the acceptability of electric charge during charging becomes low. As the amount of charging in a single time increases, the degree of stratification of the liquid-type high-grade lead-acid battery is likely to become larger. As the degree of stratification becomes larger, the acceptability of electric charge during charging becomes lower. Thus, in the liquid-type high-grade lead-acid battery, the acceptance amount is likely to become smaller during the execution period of the determination charging process as the above-described initial capacity decreases.

In contrast, in the valve regulated high-grade lead-acid battery, unlike the liquid-type high-grade lead-acid battery, the battery does easily undergo stratification when charged and discharged. In the valve regulated high-grade lead-acid battery, as the above-described initial capacity increases, the acceptance amount is likely to become smaller during the execution period of the determination charging process. Thus, whether the inclination of the above-described approximate straight line is positive or negative when the onboard lead-acid battery is a valve regulated high-grade lead-acid battery is different from whether the inclination of the above-described approximate straight line is positive or negative when the onboard lead-acid battery is a liquid-type high-grade lead-acid battery.

In the above-described configuration, when multiple pieces of information including the above-described initial capacity and the above-described acceptance amount associated with the initial capacity are acquired, the inclination of the above-described approximate straight line is calculated. According to whether the inclination of the approximate straight line is positive or negative, it is determined whether the lead-acid battery is a liquid-type high-grade lead-acid battery. Accordingly, it can be determined whether the onboard lead-acid battery is a liquid-type high-grade lead-acid battery.

As described above, the valve regulated high-grade lead-acid battery hardly undergoes stratification even if a single-time charge amount is large. In contrast, the degree of stratification of the liquid-type high-grade lead-acid battery is likely to increase as a single-time charge amount increases. In the liquid-type high-grade lead-acid battery, an increase in the degree of stratification limits an increase in the acceptance amount. That is, in a case where the liquid-type high-grade lead-acid battery is mounted on the vehicle as the lead-acid battery and the acceptance amount is large during the execution of the fully-charging process, stratification occurs due to the execution of the fully-charging process.

Even if the determination charging process is subsequently executed after the state adjustment of the lead-acid battery, the acceptance amount during the execution of determination charging process is affected by the stratification. As a result, it is hard to state that even if the determination as to whether the lead-acid battery is a liquid-type high-grade lead-acid battery using the acceptance amount during the execution of the determination charging process, the accuracy of the determination is high.

Thus, in an aspect of the battery type identifying device, the charging processor executes fully-charging process that charges the lead-acid battery so that the lead-acid battery becomes fully charged when identifying the type of the lead-acid battery, and the determination charging process on condition that the lead-acid battery has entered the given state due to a decrease in the charge amount of the lead-acid battery subsequent to completion of the execution of the fully-charging process. The battery type identifying device includes a fully-charged acceptance amount acquisition unit that acquires the acceptance amount of the lead-acid battery as a fully-charged acceptance amount during the execution period of the fully-charging process. The determination unit determines whether the lead-acid battery is a liquid-type lead-acid battery when the fully-charged acceptance amount acquired by the fully-charged acceptance amount acquisition unit is less than or equal to a threshold value. The determination unit does not make the determination when the fully-charged acceptance amount is larger than the threshold value.

In the above-described configuration, when the liquid-type high-grade lead-acid battery is mounted on the vehicle as the lead-acid battery, it is determined that the degree of stratification resulting from the execution of the fully-charging process increases as the fully-charged acceptance amount, which is a value corresponding to the acceptance amount of the lead-acid battery during the execution period of the fully-charging process, increases. Thus, when the fully-charged acceptance amount is less than the threshold value, the degree of stratification resulting from the execution of the fully-charging process is not large, and it is determined that the fully-charged acceptance amount is hardly affected by the stratification. Accordingly, the determination as to whether the lead-acid battery is a liquid-type high-grade lead-acid battery is made. In contrast, when the fully-charged acceptance amount is greater than or equal to the threshold value, the degree of stratification resulting from the execution of the fully-charging process is large, and it is determined that the fully-charged acceptance amount is greatly affected by the stratification. Thus, the determination as to whether the lead-acid battery is a liquid-type high-grade lead-acid battery is not made. This limits a decrease in the accuracy of the determination as to whether the lead-acid battery is a liquid-type high-grade lead-acid battery.

An aspect of the battery type identifying device includes a fully-charged acceptance amount acquisition unit that acquires, as a fully-charged acceptance amount, the acceptance amount of the lead-acid battery during an execution period of the fully-charging process, a soak time acquisition unit that acquires a soak time in a case where the fully-charging process was executed by the charging processor during a vehicle operation prior to a current vehicle operation, the soak time being an elapsed time from an end of a vehicle operation when the fully-charging process in a previous time was executed to a beginning of the current vehicle operation, and a fully-charged acceptance amount correction unit. In a case where the fully-charged acceptance amount acquired by the fully-charged acceptance amount acquisition unit through the execution of the fully-charging process in the previous time is referred to as a previous value of the fully-charged acceptance amount, when the soak time acquired by the soak time acquisition unit is greater than or equal to a determination soak time, the fully-charged acceptance amount correction unit corrects the previous value of the fully-charged acceptance amount so that the previous value is decreased and calculates the previous value subsequent to the decreasing correction as a corrected fully-charged acceptance amount. In a case in which the fully-charged acceptance amount acquired by the fully-charged acceptance amount acquisition unit through the execution of the fully-charging process in the current vehicle operation is set as a latest value of the fully-charged acceptance amount, the determination unit determines whether the lead-acid battery is a liquid-type lead-acid battery when a larger one of the latest value of the fully-charged acceptance amount and the corrected fully-charged acceptance amount is less than or equal to a threshold value. The determination unit does not make the determination when the larger one is larger than the threshold value.

Even if the fully-charging process is executed during the vehicle operation, when the fully-charged acceptance amount is greater than or equal to the threshold value, the determination as to whether the lead-acid battery is a liquid-type high-grade lead-acid battery is not made. The degree of stratification decreases as time elapses. That is, in a case where the liquid-type high-grade lead-acid battery is mounted as the lead-acid battery, when the time is long to some extent from the end of the vehicle operation to the beginning of the next vehicle operation, it is predicted that the stratification of the lead-acid battery has been eliminated.

In the above-described configuration, when the soak time is greater than or equal to the determination soak time, it is determined that the time is long to some extent from the end of the vehicle operation when the previous fully-charging process was executed to the beginning of the current vehicle operation. Thus, the previous value of the fully-charged acceptance amount is corrected so that the previous value decreases, and the previous value subsequent to the decreasing correction is calculated as the corrected fully-charged acceptance amount. When the lead-acid battery is a liquid-type high-grade lead-acid battery, the corrected fully-charged acceptance amount calculated in such a manner correlates with the degree of stratification of the lead-acid battery at the point in time the current vehicle operation is started.

In contrast, the latest value of the fully-charged acceptance amount correlates with the stratification resulting from the execution of the fully-charging process of the current vehicle operation.

Even if the acceptance amount of the lead-acid battery through the execution of the fully-charging process during the current vehicle operation is small, when the acceptance amount of the lead-acid battery through the execution of the previous vehicle operation is large, it is predicted that the degree of stratification of the lead-acid battery is large at the point in time the current vehicle operation is started. In this case, it is desired to determine whether the determination be made by taking into account the degree of stratification of the lead-acid battery at the point in time the current vehicle operation is started. Even if the acceptance amount of the lead-acid battery through the execution of the fully-charging process during the previous vehicle operation is small, when the acceptance amount of the lead-acid battery through the execution of the current vehicle operation is large, it is predicted that the degree of stratification of the lead-acid battery is large at the point in time the current fully-charging process is ended. In this case, it is desired to determine whether the determination be made by taking into account the degree of stratification of the lead-acid battery at the point in time the current fully-charging process is ended. In the above-described configuration, the larger one of the latest value of the fully-charged acceptance amount and the corrected fully-charged acceptance amount is used to determine whether the above-described determination is made. Thus, when the liquid-type high-grade lead-acid battery is mounted on the vehicle as the lead-acid battery, the determination as to whether the lead-acid battery is a liquid-type high-grade lead-acid battery with a large degree of stratification of the lead-acid battery is prevented from being made.

In the liquid-type high-grade lead-acid battery, the higher its temperature, the more easily the elimination of the stratification proceeds. Thus, the battery type identifying device may include a temperature association value obtaining unit that obtains a temperature association value that increases as a temperature of the lead-acid battery increases. In this case, it is preferred that the fully-charged acceptance amount correction unit correct the previous value of the fully-charged acceptance amount so that the previous value decreases as the temperature association value obtained by the temperature association value obtaining unit increases, and calculates the corrected previous value as the corrected fully-charged acceptance amount. This configuration increases the correlation between the corrected fully-charged acceptance amount and the degree of actual stratification at the point in time the current vehicle operation is started.

When the soak time is less than the determination soak time, it is determined that the time from the end of the vehicle operation in which the previous fully-charging process was executed to the beginning of the current vehicle operation is short. When the high-grade lead-acid battery is mounted on the vehicle as the lead-acid battery, the degree of stratification of the lead-acid battery is likely to still be large. Thus, it is preferred that the determination unit do not determine whether the lead-acid battery is a liquid-type lead-acid battery when the soak time acquired by the soak time acquisition unit is less than a determination soak time. In this configuration, when the degree of stratification of the lead-acid battery is likely to still be large, the determination as to whether the lead-acid battery is a liquid-type high-grade lead-acid battery is prevented from being executed.

In the high-grade lead-acid batter, when the degree of stratification of the lead-acid battery is excessively large, eliminating the stratification is difficult. In a case where eliminating the stratification of a lead-acid battery is difficult, even if the above-described method is used to determine whether the lead-acid battery is a liquid-type high-grade lead-acid battery, the accuracy of the determination is low. Thus, it is preferred that the battery type identifying device include a determination prohibition unit that prohibits a determination as to whether the lead-acid battery mounted on a vehicle is a liquid-type lead-acid battery during a period until the lead-acid battery is exchanged when the corrected fully-charged acceptance amount is greater than or equal to a determination prohibition threshold value that is larger than the threshold value in a case where the corrected fully-charged acceptance amount is larger than the latest value of the fully-charged acceptance amount.

In the above-described configuration, in a case where the liquid-type high-grade lead-acid battery is mounted on the vehicle as the lead-acid battery, when the corrected fully-charged acceptance amount is larger than the latest value of the fully-charged acceptance amount and the fully-charged acceptance amount is greater than or equal to the determination prohibition threshold value, it can be determined that eliminating the stratification of the lead-acid battery is difficult. Thus, the determination is not made during a period until the lead-acid battery mounted on the vehicle is exchanged. That is, the processes necessary for the above-described determination are not executed. This limits an increase in the control load on the battery type identifying device.

Further, it is preferred that the battery type identifying device include a determination prohibition unit that corrects the latest value of the fully-charged acceptance amount so that the latest value decreases as the temperature association value obtained by the temperature association value obtaining unit increases when the latest value of the fully-charged acceptance amount is greater than or equal to the corrected fully-charged acceptance amount and prohibits a determination as to whether the lead-acid battery mounted on a vehicle is a liquid-type lead-acid battery during a period until the lead-acid battery is exchanged when the corrected latest value is greater than or equal to a determination prohibition threshold value that is larger than the threshold value.

When the lead-acid battery is a high-grade lead-acid battery, stratification is eliminated to some extent after the elapse of time as described above. When the latest value of the fully-charged acceptance amount is corrected using the temperature association value of the lead-acid battery so that the latest value decreases, the latest value subsequent to the decreasing correction is a correlation value of the degree of stratification at the point in time a certain time has elapsed. When the latest value subsequent to the decreasing correction is greater than or equal to the identification prohibition threshold value, the elimination of stratification is determined as being difficult. Thus, the determination is not made during a period until the lead-acid battery mounted on the vehicle is exchanged. That is, the processes necessary for the above-described determination are not executed. This limits an increase in the control load on the battery type identifying device.

In addition, in the above-described battery type identifying device, the determination unit can determine that the lead-acid battery is a low-grade lead-acid battery when an internal resistance of the lead-acid battery is greater than or equal to a determination resistance value.

Additionally, a method for identifying a battery type that solves the above-described problem identifies a type of an onboard lead-acid battery. In the method for identifying the battery type, an amount of the charge amount of the lead-acid battery increased through charging of the lead-acid battery is referred to as an acceptance amount, the method causes a controller to execute a step that stops charging of the lead-acid battery until the state of the lead-acid battery has entered a given state, the given state being a state of the lead-acid battery when a charge amount decreases by a given amount from a fully-charged state, a step that executes a determination charging process that charges the lead-acid battery during a given time on condition that the lead-acid battery has entered the given state and acquires the acceptance amount of the lead-acid battery during an execution period of the determination charging process, and a step that determines whether the lead-acid battery is a liquid-type lead-acid battery using the acceptance amount acquired by the step.

In the method, the same advantage as that of the battery type identifying device can be gained by causing the controller to execute the steps.

BRIEF DESCRIPTION OF THE DRAWINGS

FIG. 16 is a table showing the relationship between a battery liquid temperature and a soak correction amount in the battery type identifying device of the fifth embodiment.

FIG. 17 is a table showing the relationship between the battery liquid temperature and a decrease correction amount in the battery type identifying device of the fifth embodiment.

FIG. 18 is a table showing the relationship between the battery liquid temperature and an identification prohibition threshold value in the battery type identifying device of the fifth embodiment.

MODES FOR CARRYING OUT THE INVENTION

First Embodiment

A battery type identifying device and a method for identifying a battery type according to a first embodiment will now be described with reference to FIGS. 1 to 5.

Figure 1:
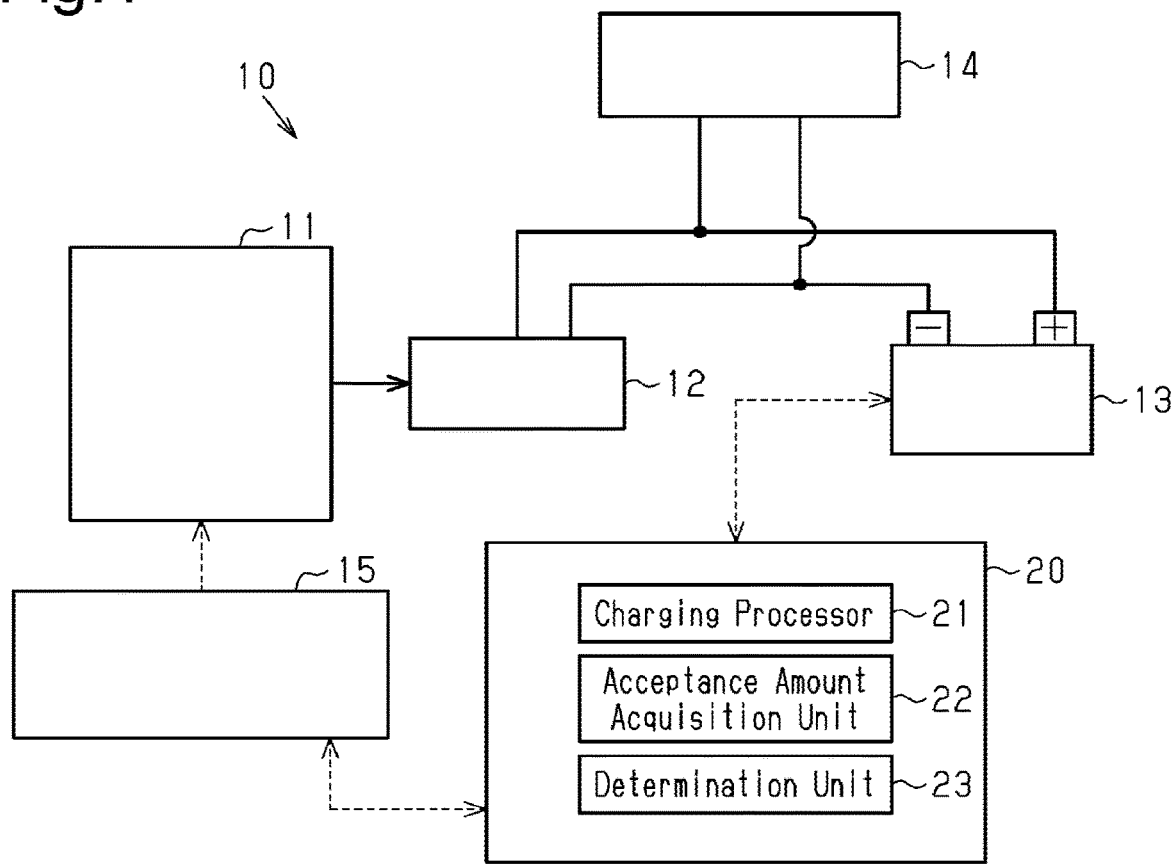
FIG. 1 is a diagram showing the configuration of the functions of a battery type identifying device according to a first embodiment and an onboard driving system including the battery type identifying device.

FIG. 1 shows an onboard driving system 10 equipped with a battery type identifying device 20 of the present embodiment. As shown in FIG. 1, the onboard driving system 10 includes an internal combustion engine 11, an alternator 12, and a lead-acid battery 13. The alternator 12 is driven using a drive torque that is output from the internal combustion engine 11. The lead-acid battery 13 is charged by the driving of the alternator 12. The lead-acid battery 13 is removable from the vehicle. Further, the onboard driving system 10 includes an onboard device 14. The onboard device 14 is driven by the power generated by the driving of the alternator 12 or by power feeding from the lead-acid battery 13. The onboard device 14 is, for example, an accessory such as an onboard audio system or an air conditioner.

The battery type identifying device 20 identifies the lead-acid battery 13 after, for example, the lead-acid battery 13 is exchanged and when the type of the onboard lead-acid battery 13 cannot be identified. More specifically, the battery type identifying device 20 determines whether the onboard lead-acid battery 13 is a high-grade lead-acid battery or a low-grade lead-acid battery. When determining that the lead-acid battery 13 is a high-grade lead-acid battery, the battery type identifying device 20 identifies whether the lead-acid battery 13 is a liquid-type high-grade lead-acid battery or a valve regulated high-grade lead-acid battery. The battery type identifying device 20 transmits the result of the identification to an engine controller 15 that controls the internal combustion engine 11. The engine controller 15 controls the internal combustion engine 11 using the result of the identification received from the battery type identifying device 20.

When the lead-acid battery 13 is removed from the vehicle, the information related to the lead-acid battery 13 is deleted from within the battery type identifying device 20. Thus, the battery type identifying device 20 determines that the lead-acid battery 13 has been exchanged when the information related to the lead-acid battery 13 is deleted.

The high-grade lead-acid battery refers to a lead-acid battery suitable for being repeatedly charged and discharged by the idling stop function of the internal combustion engine 11. The low-grade lead-acid battery refers to a low-grade lead-acid battery that is not suitable for being repeatedly charged and discharged by the idling stop function. The internal resistance IR of the low-grade lead-acid battery is higher than the internal resistance IR of the high-grade lead-acid battery. Thus, the low-grade lead-acid battery is not suitable for being used to repeatedly charge and discharge the lead-acid battery 13. Accordingly, when the lead-acid battery 13 is a low-grade lead-acid battery, the engine controller 15 stops and disables the idling stop function of the internal combustion engine 11 that automatically stops the engine operation and automatically restarts the engine operation. When the lead-acid battery 13 is a high-grade lead-acid battery, the engine controller 15 enables the idling stop function of the internal combustion engine 11.

Thus, when the type of the lead-acid battery 13 still cannot be identified, the battery type identifying device 20, for example, instructs the engine controller 15 to stop the idling stop function of the internal combustion engine 11.

Figure 2:
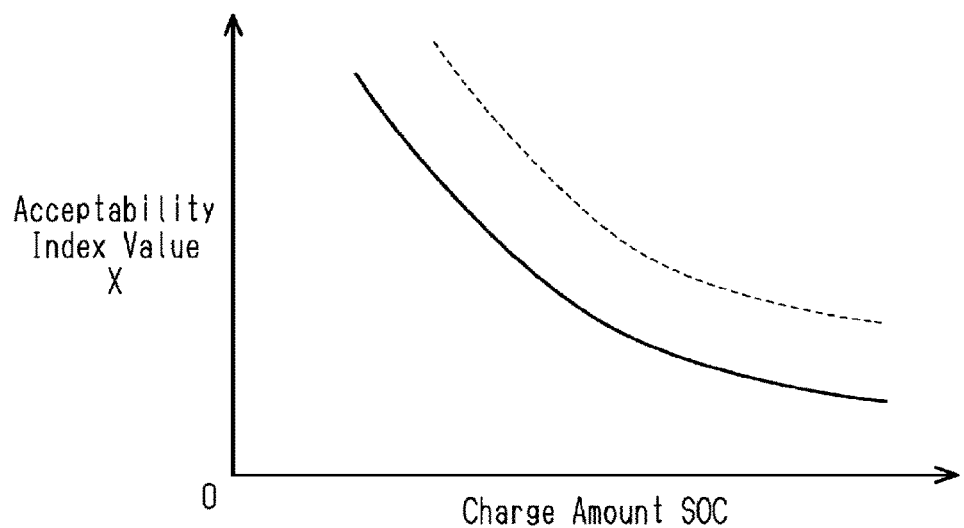
FIG. 2 is a graph showing the relationship between a charge amount and an acceptability index value of the lead-acid battery.

The liquid-type lead-acid battery and the valve regulated lead-acid battery have the following characteristics. FIG. 2 shows the relationship between the charge amount SOC of the lead-acid battery and the acceptability of electric charge of the lead-acid battery. In FIG. 2, an acceptability index value X is obtained by quantifying the acceptability of electric charge, and it can be determined that the acceptability of electric charge of the lead-acid battery becomes better as the acceptability index value X increases. In FIG. 2, the solid line shows the relationship between the charge amount SOC and the acceptability index value X in the valve regulated lead-acid battery, and the broken line shows the relationship between the charge amount SOC and the acceptability index value X in the liquid-type lead-acid battery. As shown in FIG. 2, regardless of the liquid-type lead-acid battery or the valve regulated lead-acid battery, the acceptability index value X decreases as the charge amount SOC increases. However, regardless of which value the charge amount SOC is, the acceptability of electric charge is better in the liquid-type lead-acid battery than the acceptability of electric charge in the valve regulated lead-acid battery.

As shown in FIG. 1, the battery type identifying device 20 includes a charging processor 21, an acceptance amount acquisition unit 22, and a determination unit 23, as functional units that identify the type of the onboard lead-acid battery 13.

The charging processor 21 controls the charge amount SOC of the lead-acid battery 13. That is, the charging processor 21 executes a fully-charging process that charges the lead-acid battery 13 so that the lead-acid battery 13 is fully charged. Further, the charging processor 21 executes a determination charging process that charges the lead-acid battery 13 during a given time Ts on condition that the state of the lead-acid battery 13 has entered a given state due to a decrease in the charge amount SOC from the fully-charged state. The given state refers to the state of the lead-acid battery 13 when the charge amount SOC decreases from the fully-charged state by a given amount SSOC. For example, the decrease amount of the charge amount SOC can be calculated using the value of current when the lead-acid battery 13 is discharged. Thus, the battery type identifying device 20 calculates the decrease amount of the charge amount SOC by detecting the value of current when the lead-acid battery 13 is discharged. When the state of the lead-acid battery 13 is the given state, the state of the lead-acid battery 13 is not fully charged but the charge amount SOC of the lead-acid battery 13 is relatively large.

The acceptance amount acquisition unit 22 acquires an acceptance amount AC of the lead-acid battery 13 during the period in which the determination charging process is executed by the charging processor 21. The acceptance amount AC refers to the amount of the charge amount SOC increased during charging of the lead-acid battery 13. The acceptance amount AC can be calculated using the value of current flowing through the lead-acid battery 13 when the lead-acid battery 13 is charged. Thus, the battery type identifying device 20 calculates the acceptance amount AC by detecting the value of current flowing through the lead-acid battery 13 when the lead-acid battery 13 is charged.

The determination unit 23 identifies the lead-acid battery 13 using the acceptance amount AC of the lead-acid battery 13 in the execution period of the determination charging process, which has been acquired by the acceptance amount acquisition unit 22, and the internal resistance IR of the lead-acid battery 13. The internal resistance IR can be calculated using the value of current flowing through the lead-acid battery 13 and the voltage of the lead-acid battery 13. Thus, the battery type identifying device 20 calculates the internal resistance IR by detecting the value of current flowing through the lead-acid battery 13 and the value of the voltage of the lead-acid battery 13. When the internal resistance IR of the lead-acid battery 13 is greater than or equal to a determination resistance value IRTh, the determination unit 23 determines that the lead-acid battery 13 is a low-grade lead-acid battery. When the acceptance amount AC of the lead-acid battery 13 during the execution period of the determination charging process is larger than a determination acceptance amount ACTh, the determination unit 23 determines that the lead-acid battery 13 is a liquid-type high-grade lead-acid battery. When the internal resistance IR of the lead-acid battery 13 is less than the determination resistance value IRTh and the acceptance amount AC of the lead-acid battery 13 during the execution period of the determination charging process is less than or equal to the determination acceptance amount ACTh, the determination unit 23 determines that the lead-acid battery 13 is a valve regulated high-grade lead-acid battery.

Figure 3:
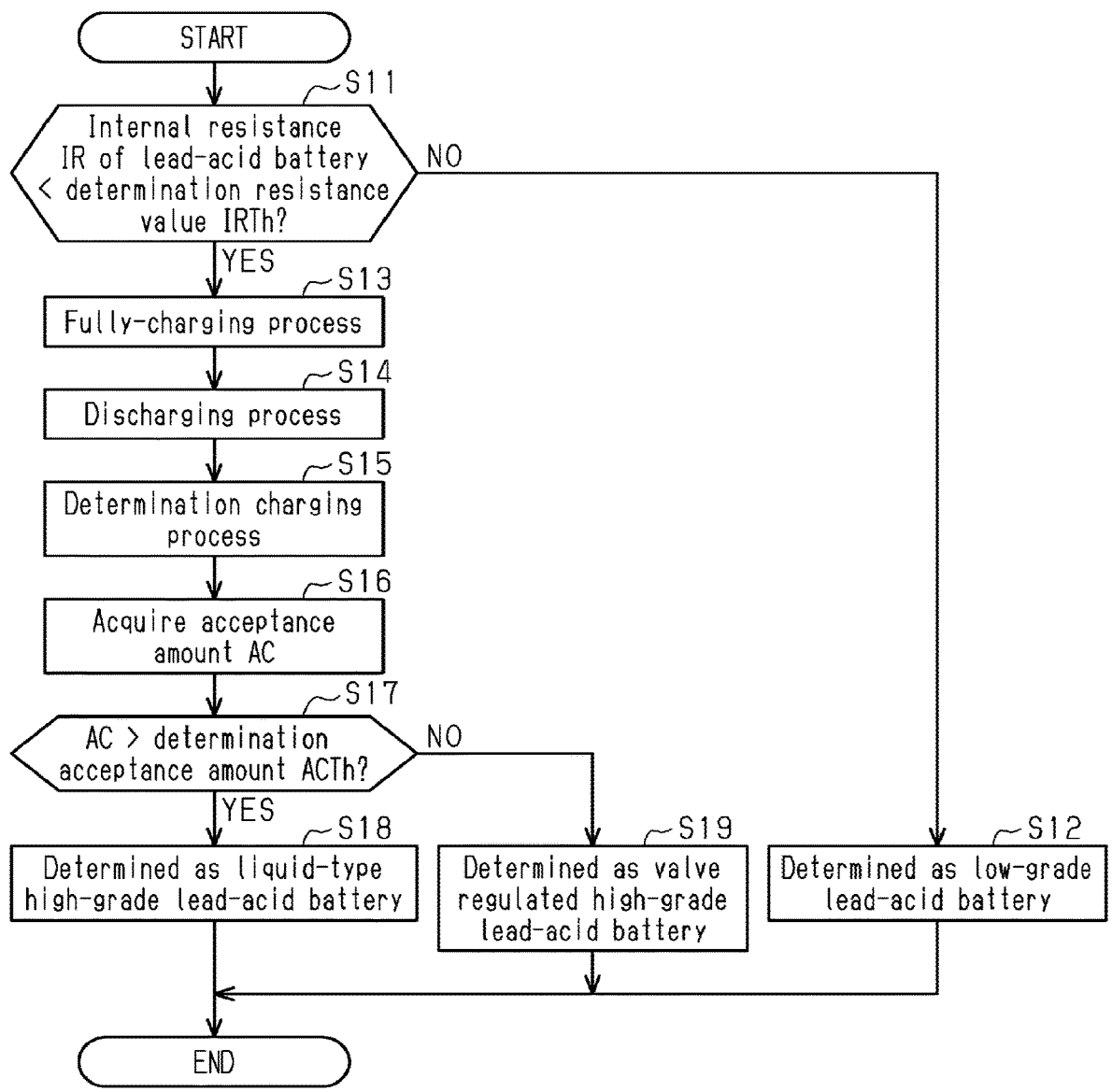
FIG. 3 is a flowchart illustrating the procedure for identifying the type of the lead-acid battery in the battery type identifying device of the first embodiment.
Figure 4:
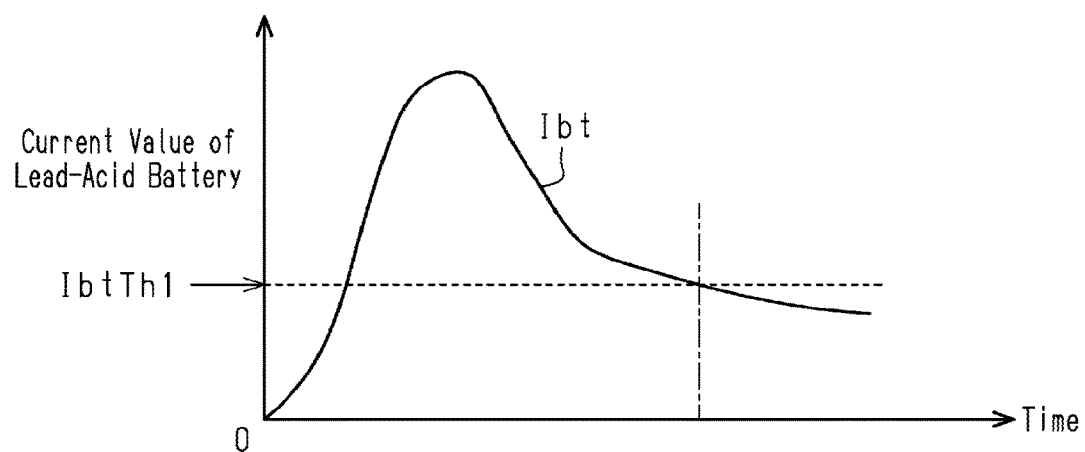
FIG. 4 is a graph showing changes in the value of current flowing through the lead-acid battery when the lead-acid battery is charged.

The method for identifying the battery type will now be described with reference to FIGS. 3 and 4. A series of processes shown in FIG. 3 are executed by the battery type identifying device 20 when the type of the onboard lead-acid battery 13 has still not been identified. That is, in the present embodiment, the battery type identifying device 20 corresponds to a controller that executes the steps of the method for identifying the battery type.

As shown in FIG. 3, first, in step S11, it is determined whether the internal resistance IR of the lead-acid battery 13 is less than the determination resistance value IRTh. The determination resistance value IRTh is set to a value that can be used to determine whether the lead-acid battery 13 is a low-grade lead-acid battery. When the internal resistance IR is greater than or equal to the determination resistance value IRTh (S11: NO), the process is advanced to the next step S12. In step S12, the determination unit 23 determines that the lead-acid battery 13 is a low-grade lead-acid battery. That is, when the internal resistance IR is greater than or equal to the determination resistance value IRTh, it is determined that the lead-acid battery 13 is a low-grade lead-acid battery regardless of the magnitude of the acceptance amount AC of the lead-acid battery 13. Subsequently, the series of processes shown in FIG. 3 are ended.

In step S11, when the internal resistance IR of the lead-acid battery 13 is less than the determination resistance value IRTh (YES), it is determined that the lead-acid battery 13 is a high-grade lead-acid battery. Thus, the process is advanced to the next step S13. In step S13, the charging processor 21 executes the fully-charging process.

When the fully-charging process is executed, a current value Ibt of the lead-acid battery 13 is monitored. The current value Ibt refers to the value of current flowing through the lead-acid battery 13. As shown in FIG. 4, when the fully-charging process is started, the current value Ibt increases. As the state of the lead-acid battery 13 becomes close to the fully-charged state, the current value Ibt starts decreasing instead of increasing. In such a situation where the current value Ibt is decreasing, when the current value Ibt has changed from being larger than a fully-charged determination current value IbtTh1 to being less than or equal to the fully-charged determination current value IbtTh1, it is determined that the lead-acid battery 13 has become fully charged. Thus, the execution of the fully-charging process is ended.

Referring back to FIG. 3, when the execution of the fully-charging process is ended, the process is advanced to the next step S14. In step S14, the charging processor 21 executes a discharging process. The discharging process refers to a process that stops the charging of the lead-acid battery 13 until the charge amount SOC of the lead-acid battery 13 decreases by the given amount SSOC, that is, a process that stops the generation of power through the driving of the alternator 12. That is, in the present embodiment, step S14 corresponds to a step that stops the charging of the lead-acid battery 13 until the state of the lead-acid battery 13 changes from the fully-charged state to the given state.

When the execution of the discharging process is ended, it is determined that state adjustment of adjusting the state of the lead-acid battery 13 to the given state is completed. Thus, the process is advanced to the next step S15. In step S15, the charging processor 21 executes a determination charging process. When the execution of the determination charging process is ended after the elapse of the given time Ts, the acceptance amount acquisition unit 22 acquires the acceptance amount AC of the lead-acid battery 13 during the execution period of the determination charging process. That is, in the present embodiment, steps S15 and S16 correspond to a step that executes the determination charging process on condition that the state of the lead-acid battery 13 has entered the given state and acquires the acceptance amount AC of the lead-acid battery 13 during the execution period of the determination charging process.

When the acceptance amount AC is acquired, the process is advanced to the next step S17. In step S17, the determination unit 23 determines whether the acquired acceptance amount AC is larger than the determination acceptance amount ACTh. The determination acceptance amount ACTh is a determination value used to determine whether the lead-acid battery 13 is a liquid-type high-grade lead-acid battery. That is, in the present embodiment, step S17 corresponds to a step that determines whether the lead-acid battery 13 is a liquid-type high-grade lead-acid battery using the acceptance amount AC of the lead-acid battery 13 during the execution period of the determination charging process.

In step S17, when the acceptance amount AC of the lead-acid battery 13 during the execution period of the determination charging process is larger than the determination acceptance amount ACTh (YES), the process is advanced to the next step S18. In step S18, the determination unit 23 determines that the lead-acid battery 13 is a liquid-type high-grade lead-acid battery. Subsequently, the series of processes shown in FIG. 3 are ended. When the acceptance amount AC is less than or equal to the determination acceptance amount ACTh (S17: NO), the process is advanced to the next step S19. In step S19, the determination unit 23 determines that the lead-acid battery 13 is a valve regulated high-grade lead-acid battery. Subsequently, the series of processes shown in FIG. 3 are ended.

The operation and advantages of the present embodiment will now be described with reference to FIG. 5.

At the beginning of the engine operation, when it is determined by, for example, detecting that the onboard lead-acid battery 13 has been exchanged that the type of the onboard lead-acid battery 13 has still not been identified, the series of processes shown in FIG. 3 are executed. In the example of FIG. 5, since the internal resistance IR of the lead-acid battery 13 is less than the determination resistance value IRTh, the fully-charging process is executed. That is, when it is determined that the lead-acid battery 13 is a high-grade lead-acid battery, the fully-charging process is executed. As a result, referring to FIG. 5, the charge amount SOC of the lead-acid battery 13 is increased by the driving of the alternator 12. When the lead-acid battery 13 becomes fully charged at timing t11, the discharging process is executed. During the execution of the discharging process, the alternator 12 does not generate power whereas the onboard device 14 is driven by the power feeding from the lead-acid battery 13. Thus, the charge amount SOC of the lead-acid battery 13 gradually decreases.

At timing t12, the decrease amount of the charge amount SOC from timing t11 reaches the given amount SSOC, and it is determined that the state of the lead-acid battery 13 has entered the given state. When the state adjustment of the lead-acid battery 13 is completed in such a manner, the execution of the discharging process is ended and the execution of the determination charging process is started. In the execution of the determination charging process, the charge amount SOC of the lead-acid battery 13 is increased by the driving of the alternator 12. At timing t13, at which the given time Ts has elapsed from timing 12, the determination charging process is ended. Further, at timing t13, the increase amount of the charge amount SOC within a period from timing t12 to timing t13 is acquired as the acceptance amount AC of the lead-acid battery 13 during the execution period of the determination charging process.

In the present embodiment, after the state of the lead-acid battery 13 is set to the given state due to a decrease in the charge amount SOC from the fully-charged state, the lead-acid battery 13 is charged in order to acquire the acceptance amount AC used for determination. That is, after completion of the state adjustment of the lead-acid battery 13, the determination charging process is executed. When the state of the lead-acid battery 13 is the given state, the charge amount SOC of the lead-acid battery 13 is relatively large although not fully charged. Thus, it is determined whether the lead-acid battery 13 is a liquid-type high-grade lead-acid battery using the acceptance amount AC during the execution period of the determination charging process.

Figure 5:
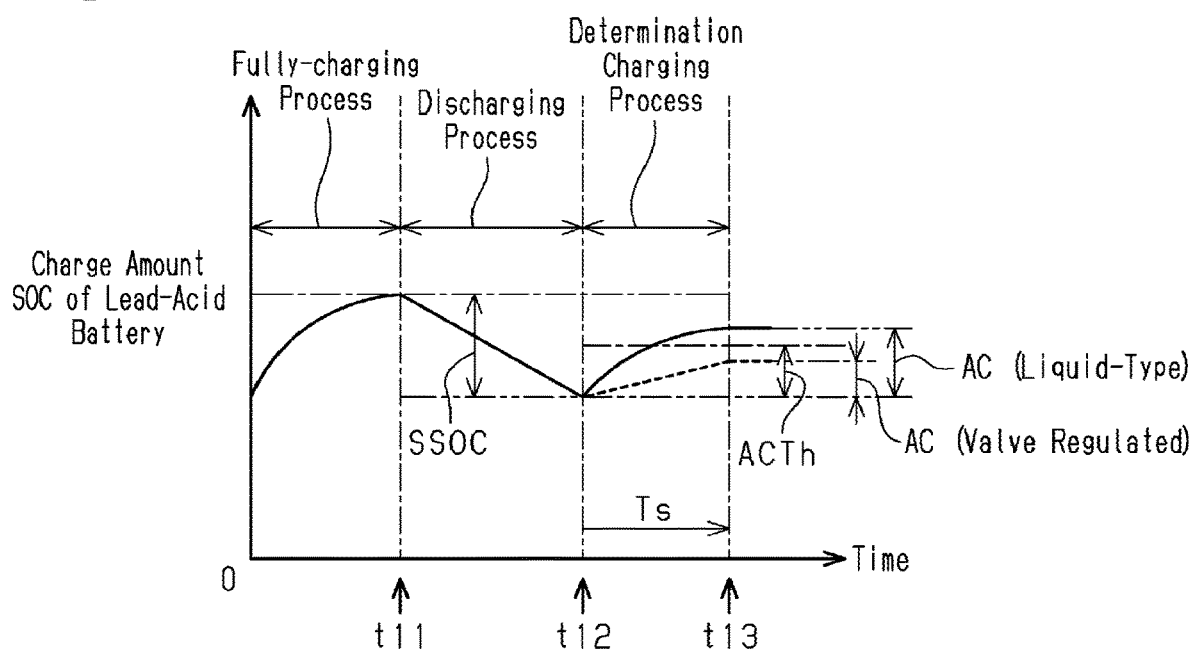
FIG. 5 is a timing chart showing changes in the charge amount of the lead-acid battery when the process that determines the type of the lead-acid battery is executed in the battery type identifying device of the first embodiment.

More specifically, when the acceptance amount AC of the lead-acid battery 13 during the execution period of the determination charging process is larger than the determination acceptance amount ACTh as shown by the solid line in FIG. 5, it is determined that the lead-acid battery 13 is a liquid-type high-grade lead-acid battery. When the acceptance amount AC of the lead-acid battery 13 is less than or equal to the determination acceptance amount ACTh as shown by the broken line in FIG. 5, it is determined that the lead-acid battery 13 is a valve regulated high-grade lead-acid battery. Accordingly, in the present embodiment, the type of the lead-acid battery 13 can be determined.

In addition to the above-described advantage, the present embodiment has the following advantages.

The internal resistance IR of the high-grade lead-acid battery is lower than the internal resistance IR of the low-grade lead-acid battery. Thus, in the present embodiment, when the internal resistance IR is greater than or equal to the determination resistance value IRTh, it is determined that the lead-acid battery 13 is a liquid-type low-grade lead-acid battery. Accordingly, in the present embodiment, it can be determined whether the lead-acid battery 13 is a liquid-type low-grade lead-acid battery.

Additionally, in the present embodiment, it is determined whether the internal resistance IR of the lead-acid battery 13 is less than the determination resistance value IRTh prior to the execution of the fully-charging process, the discharging process, and the determination charging process. Thus, when the internal resistance IR of the lead-acid battery 13 is greater than or equal to the determination resistance value IRTh and is thus it is determined that the lead-acid battery 13 is a low-grade lead-acid battery, various processes such as the fully-charging process, the discharging process, and the determination charging process are not executed. This limits unnecessary execution of the various processes.

Second Embodiment

A battery type identifying device and a method for identifying a battery type according to a second embodiment will now be described with reference to FIG. 6. The second embodiment differs from the first embodiment in some of the procedure for identifying the type of the lead-acid battery 13. Accordingly, the difference from the first embodiment will mainly be described hereafter, and like or same reference numerals are given to those components that are the same as the corresponding components of the first embodiment. Such components will not be described.

The method for identifying the battery type in the present embodiment will now be described with reference to FIG. 6. A series of processes shown in FIG. 6 are executed by the battery type identifying device 20 when the type of the onboard lead-acid battery 13 has still not been identified. That is, in the present embodiment, the battery type identifying device 20 corresponds to the controller that executes the steps of the method for identifying the battery type.

Figure 6:
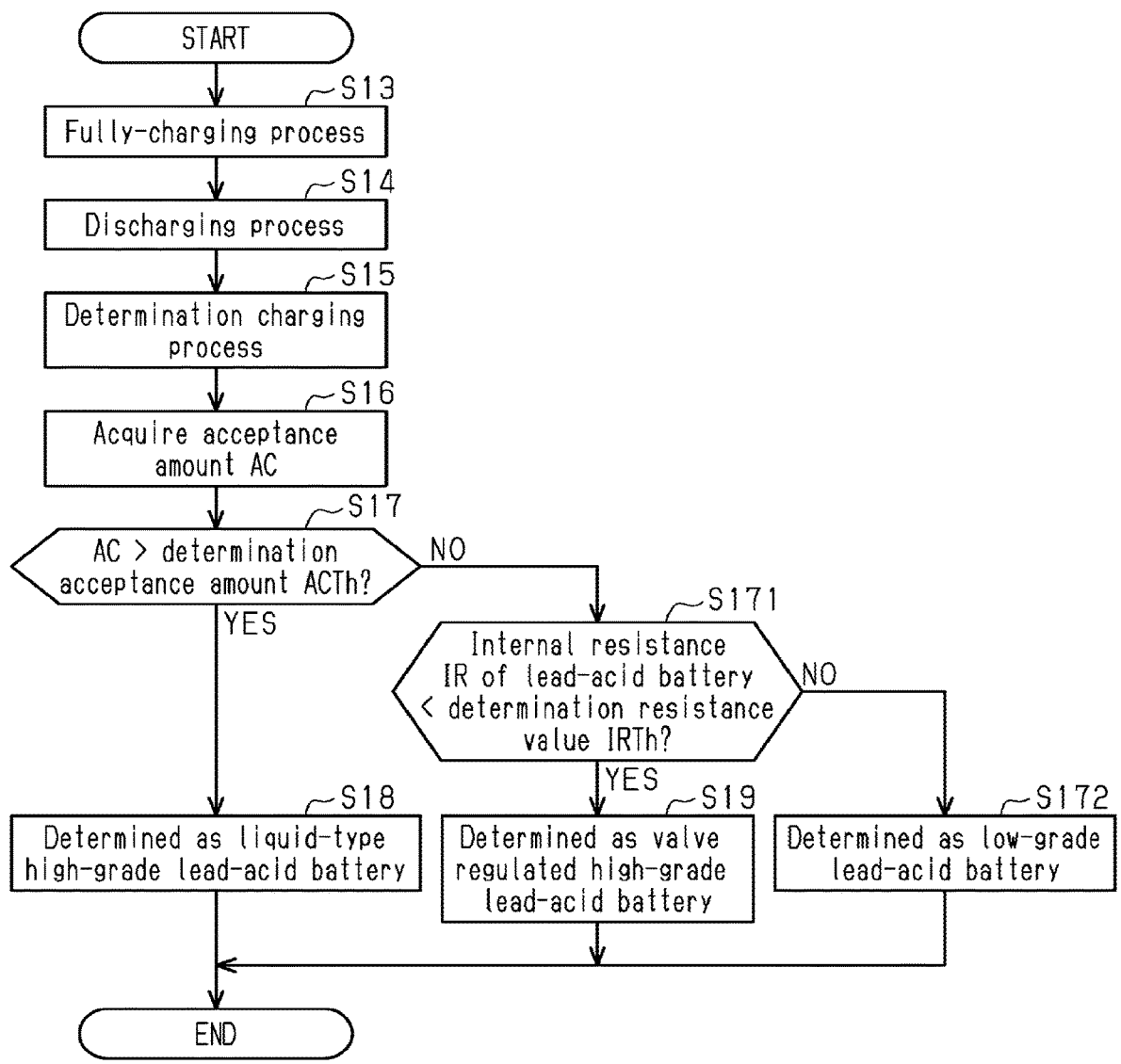
FIG. 6 is a flowchart illustrating the procedure for identifying the type of the lead-acid battery in a battery type identifying device according to a second embodiment.

As shown in FIG. 6, the fully-charging process is executed by the charging processor 21 in step S13, and the discharging process is executed by the charging processor 21 in the next step S14. Subsequently, the determination charging process is executed by the charging processor 21 in step S15, and the acceptance amount AC of the lead-acid battery 13 during the execution period of the determination charging process is acquired by the acceptance amount acquisition unit 22 in the next step S16. Then, in step S17, the determination unit 23 determines whether the acceptance amount AC of the lead-acid battery 13 during the execution period of the determination charging process is larger than the determination acceptance amount ACTh. In step S17, when the acceptance amount AC of the lead-acid battery 13 is larger than the determination acceptance amount ACTh (YES), the process is advanced to the next step S18. In step S18, the determination unit 23 determines that the lead-acid battery 13 is a liquid-type high-grade lead-acid battery. Subsequently, the series of processes shown in FIG. 6 are ended.

When the acceptance amount AC of the lead-acid battery 13 during the execution period of the determination charging process is less than or equal to the determination acceptance amount ACTh (S17: NO), the process is advanced to the next step S171. In step S171, the determination unit 23 determines whether the internal resistance IR of the lead-acid battery 13 is less than the determination resistance value IRTh. When the internal resistance IR is less than the determination resistance value IRTh (S171: YES), the process is advanced to the next step S19. In step S19, the determination unit 23 determines that the lead-acid battery 13 is a valve regulated high-grade lead-acid battery. Subsequently, the series of processes shown in FIG. 6 are ended. When the internal resistance IR is greater than or equal to the determination resistance value IRTh (S171: NO), the process is advanced to the next step S172. In step S172, the determination unit 23 determines that the lead-acid battery 13 is a low-grade lead-acid battery. That is, when the internal resistance IR is greater than or equal to the determination resistance value IRTh and the acceptance amount AC is less than or equal to the determination acceptance amount ACTh, it is determined that the lead-acid battery 13 is a low-grade lead-acid battery. Subsequently, the series of processes shown in FIG. 6 are ended.

More specifically, in the present embodiment, in the same manner as the first embodiment, when the acceptance amount AC of the lead-acid battery 13 during the execution period of the determination charging process is larger than the determination acceptance amount ACTh, it is determined that the lead-acid battery 13 is a liquid-type high-grade lead-acid battery. Further, when the acceptance amount AC is less than or equal to the determination acceptance amount ACTh and the internal resistance IR of the lead-acid battery 13 is less than the determination resistance value IRTh, it is determined that the lead-acid battery 13 is a valve regulated high-grade lead-acid battery. Furthermore, when the internal resistance IR of the lead-acid battery 13 is greater than or equal to the determination resistance value IRTh, it is determined that the lead-acid battery 13 is a low-grade lead-acid battery.

Third Embodiment

A battery type identifying device and a method for identifying a battery type according to a third embodiment will now be described with reference to FIGS. 7 to 9. The third embodiment differs from the second embodiment in the method for identifying the type of the lead-acid battery 13. Accordingly, the difference from the first and second embodiments will mainly be described hereafter, and like or same reference numerals are given to those components that are the same as the corresponding components of the first and second embodiments. Such components will not be described.

In the present embodiment, the acceptance amount acquisition unit 22 acquires an initial capacity IC when the charging processor 21 starts executing the fully-charging process. The initial capacity IC refers to the charge amount SOC of the lead-acid battery 13 when the fully-charging process is started. Further, after acquiring the initial capacity IC, the acceptance amount acquisition unit 22 acquires, in association with the initial capacity IC, the acceptance amount AC of the lead-acid battery 13 during a subsequent period in which the charging processor 21 executes the determination charging process.

The determination unit 23 determines whether the lead-acid battery 13 is a liquid-type high-grade lead-acid battery using information including the initial capacity IC and the acceptance amount AC associated with the initial capacity IC.

The method for identifying the battery type in the present embodiment will now be described with reference to FIGS. 7 and 8. A series of processes shown in FIG. 7 are repeatedly executed by the battery type identifying device 20 when the type of the onboard lead-acid battery 13 has still not been identified. That is, in the present embodiment, the battery type identifying device 20 corresponds to the controller that executes the steps of the method for identifying the battery type.

Figure 7:
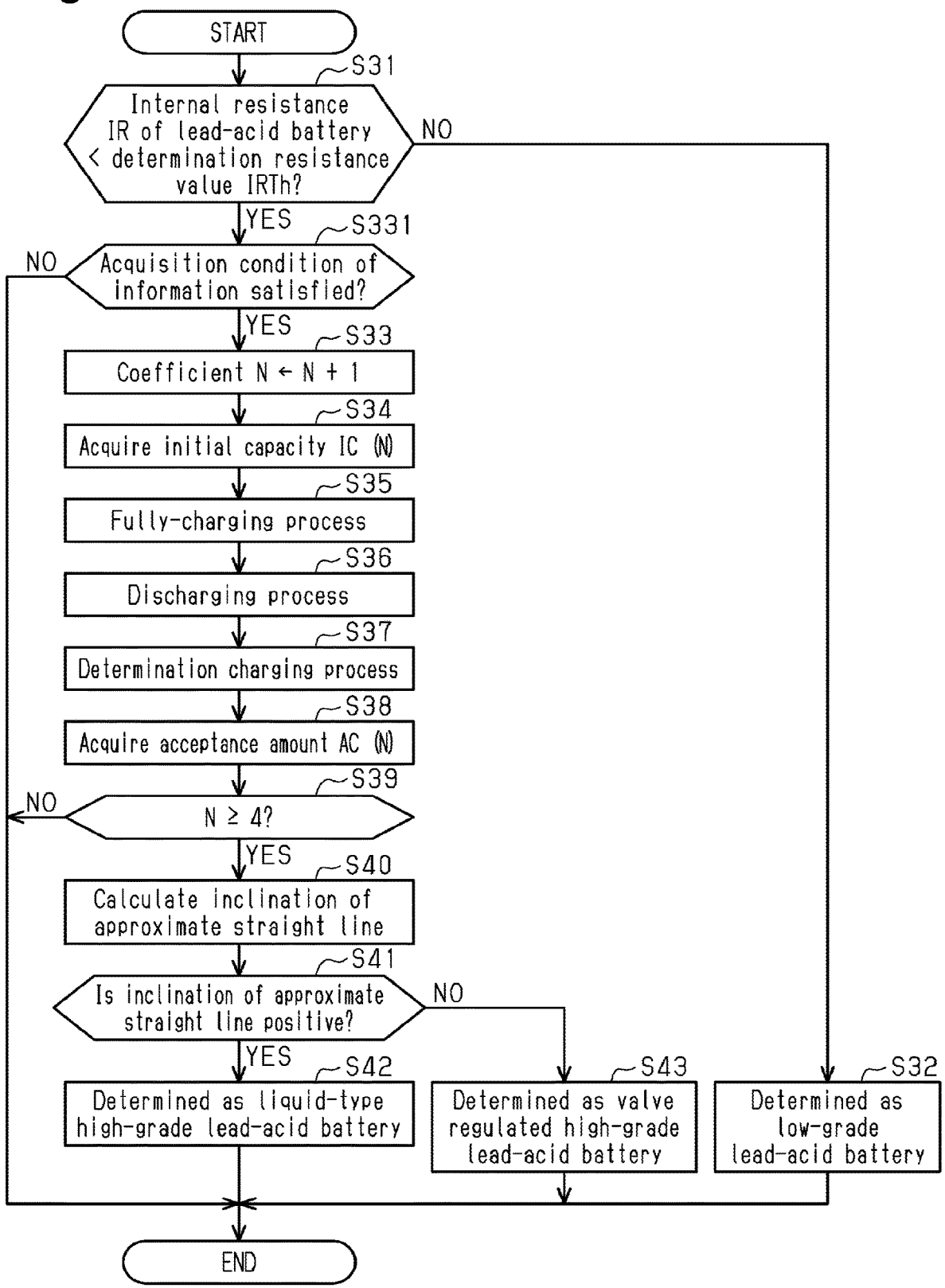
FIG. 7 is a flowchart illustrating the procedure for identifying the type of the lead-acid battery in a battery type identifying device according to a third embodiment.

In a case where the engine has not been operated even once after the exchange of the lead-acid battery, the series of processes shown in FIG. 7 are executed when the engine is operated for the first time after the exchange of the lead-acid battery. Subsequently, in a case where the type of the lead-acid battery 13 has still not been identified even after the end of the series of processes shown in FIG. 7, the series of processes are executed when the engine is still being operated. Also, in a case where the type of the lead-acid battery 13 has still not been identified during the next engine operation, the series of processes shown in FIG. 7 are executed.

As shown in FIG. 7, when the internal resistance IR of the lead-acid battery 13 is greater than or equal to the determination resistance value IRTh in step S31 (NO), the determination unit 23 determines in the next step S32 that the lead-acid battery 13 is a low-grade lead-acid battery. Then, the series of processes illustrated in FIG. 7 are ended. When the internal resistance IR of the lead-acid battery 13 is less than the determination resistance value IRTh (S31: YES), it is determined that the lead-acid battery 13 is a high-grade lead-acid battery. Thus, the process is advanced to the next step S331. In step S331, it is determined whether an acquisition condition of information has been satisfied. In the present embodiment, as will be described in detail later, multiple pieces of information including the initial capacity IC and the acceptance amount AC associated with the initial capacity IC are acquired, and the multiples pieces of information are used to determine whether the lead-acid battery 13 is a liquid type or a valve regulated type. In step S331, when the information that has been already acquired does not contain the information including the initial capacity IC that has the same value as the current charge amount SOC, it is determined that the acquisition condition has been satisfied. When the information that has been already acquired contains the information including the initial capacity IC that has the same value as the current charge amount SOC, it is not determined that the acquisition condition has been satisfied. Additionally, when a single piece of information has not been acquired, it is determined that the acquisition condition has been satisfied.

In step S331, when the acquisition condition of information has not been satisfied (NO), the series of processes shown in FIG. 7 are ended. When the acquisition condition of information has been satisfied (S331: YES), the process is advanced to the next step S33. In step S33, coefficient N is incremented by 1. When the lead-acid battery 13 is exchanged, coefficient N is reset to 0.

In the next step S34, the acceptance amount acquisition unit 22 acquires the current charge amount SOC of the lead-acid battery 13 as the initial capacity IC (N). When the initial capacity IC (N) is acquired, the process is advanced to the next step S35. In step S35, the charging processor 21 executes the fully-charging process in the same manner as the above-described step S13.

When the execution of the fully-charging process is ended, the process is advanced to the next step S36. In step S36, the charging processor 21 executes the discharging process in the same manner as the above-described step S14. That is, in the present embodiment, step S36 refers to the step that stops the charging of the lead-acid battery 13 until the state of the lead-acid battery 13 changes from the fully-charged state to the given state. When the execution of the discharging process is ended, it is determined that the state adjustment of the lead-acid battery 13 is completed. Thus, the process is advanced to the next step S37. In step S37, the charging processor 21 executes the determination charging process in the same manner as the above-described step S15. When the execution of the determination charging process is ended, the process is advanced to the next step S38.

In step S38, the acceptance amount acquisition unit 22 acquires the acceptance amount AC (N) of the lead-acid battery 13 during the execution period of the determination charging process. The acceptance amount AC (N) is acquired in association with the initial capacity IC (N) acquired in step S34. Accordingly, in the present embodiment, steps S37 and S38 correspond to the step that executes the determination charging process on condition that the state of the lead-acid battery 13 has entered the given state and acquires the acceptance amount AC (N) of the lead-acid battery 13 during the execution period of the determination charging process.

When the acceptance amount AC (N) of the lead-acid battery 13 during the execution period of the determination charging process is acquired, the process is advanced to the next step S39. In step S39, it is determined whether coefficient N is greater than or equal to 4. Coefficient N refers to a value that is incremented every time the information including the initial capacity IC (N) and the acceptance amount AC (N) associated with the initial capacity IC (N) is acquired. Thus, when four or more pieces of the information including the initial capacity IC (N) and the acceptance amount AC (N) associated with the initial capacity IC (N) are acquired, the determination of step S39 is YES. When three or less pieces of the information including the initial capacity IC (N) and the acceptance amount AC (N) associated with the initial capacity IC (N) are acquired, the determination of step S39 is NO.

When coefficient N is less than or equal to 3 in step S39 (NO), the series of processes shown in FIG. 7 are ended. In this case, the type of the lead-acid battery 13 has still not been identified. Thus, the series of processes shown in FIG. 7 are executed again in another occasion.

When coefficient N is greater than or equal to 4 (YES: S39), the process is advanced to the next step S40. In step S40, the inclination of an approximate straight line indicating the association between the initial capacity IC (N) and the acceptance amount AC (N) associated with the initial capacity IC (N) is calculated.

Figure 8:
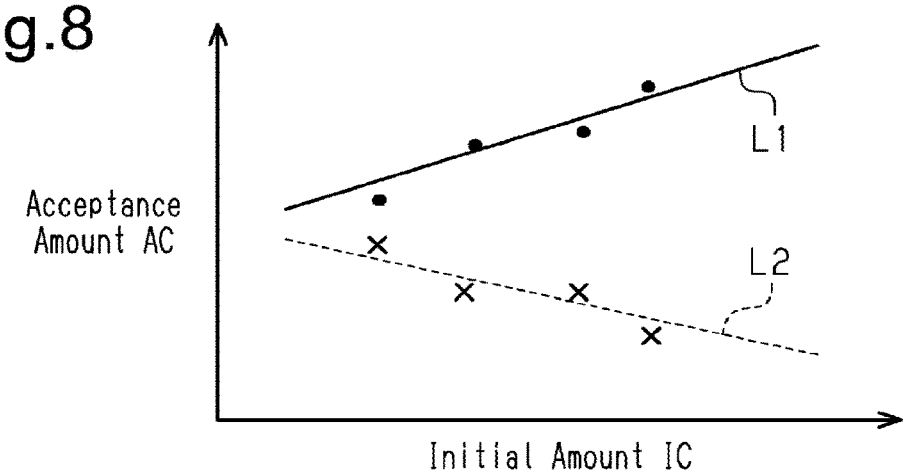
FIG. 8 is a graph showing the relationship between an initial capacity and an acceptance amount of the lead-acid battery during the execution period of the determination charging process.
Figure 9:
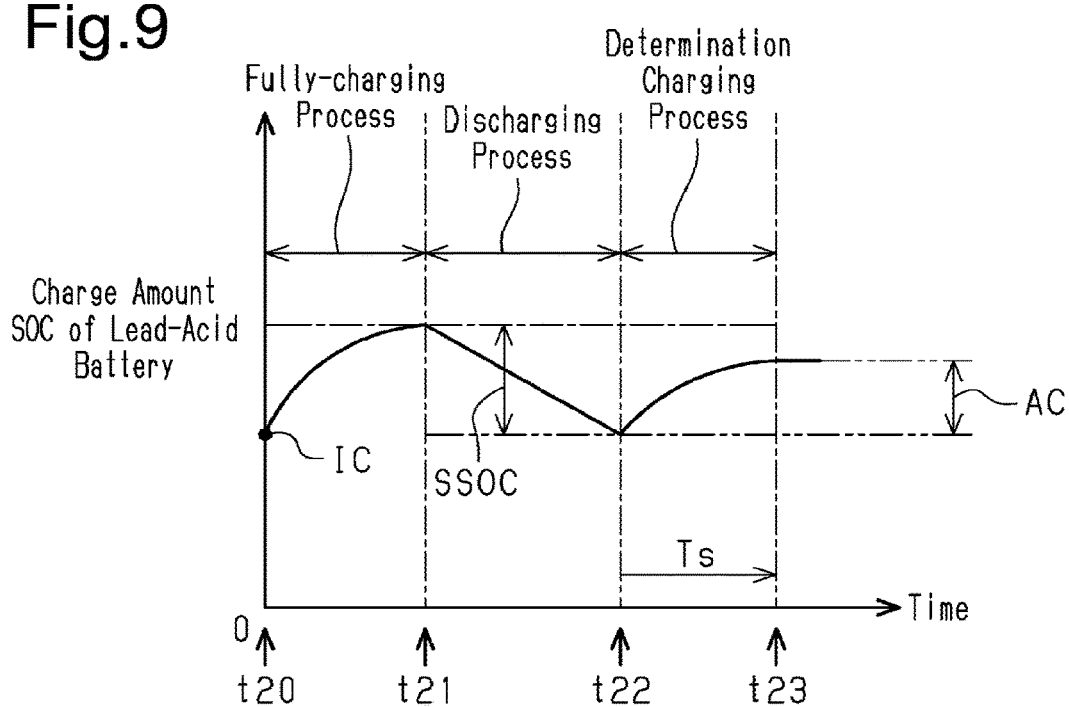
FIG. 9 is a timing chart showing changes in the charge amount of the lead-acid battery when the process that determines the type of the lead-acid battery is executed in the battery type identifying device of the third embodiment.

FIG. 8 illustrates examples of approximate straight lines indicating the initial capacity IC (N) and the acceptance amount AC (N) associated with the initial capacity IC (N). In the graph shown in FIG. 8, the horizontal axis indicates the initial capacity IC, and the vertical axis indicates the acceptance amount AC of the lead-acid battery 13 during the execution period of the determination charging process. The dots in FIG. 8 indicate the coordinate positions of the initial capacity IC (N) and the acceptance amount AC (N) associated with the initial capacity IC (N) acquired when the lead-acid battery 13 is a liquid-type high-grade lead-acid battery. The solid line in FIG. 8 is an approximate straight line L1 in a case where the lead-acid battery 13 is a liquid-type high-grade lead-acid battery. The approximate straight line L1 is obtained using a primary approximate expression calculated in reference to multiple pieces of information including the initial capacity IC (N) and the acceptance amount AC (N) associated with the initial capacity IC (N). The inclination of the approximate straight line L1 is positive. That is, as the initial capacity IC increases, the acceptance amount AC increases.

The Xs in FIG. 8 indicate the coordinate positions of the initial capacity IC (N) and the acceptance amount AC (N) associated with the initial capacity IC (N) acquired when the lead-acid battery 13 is a valve regulated high-grade lead-acid battery. The broken line in FIG. 8 is an approximate straight line L2 in a case where the lead-acid battery 13 is a valve regulated high-grade lead-acid battery. The approximate straight line L2 is obtained using a primary approximate expression calculated in reference to multiple pieces of information including the initial capacity IC (N) and the acceptance amount AC (N) associated with the initial capacity IC (N). The inclination of the approximate straight line L2 is negative. That is, as the initial capacity IC increases, the acceptance amount AC decreases.

Referring back to FIG. 7, when the execution of the approximate straight line is calculated, the process is advanced to the next step S41. In step S41, the determination unit 23 determines whether the inclination of the approximate straight line is positive. When the inclination of the approximate straight line is positive (S41: YES), the process is advanced to the next step S42. In step S42, the determination unit 23 determines that the lead-acid battery 13 is a liquid-type high-grade lead-acid battery. Subsequently, the series of processes illustrated in FIG. 7 are ended. When the inclination of the approximate straight line is not positive (S41: NO), the process is advanced to the next step S43. In step S43, the determination unit 23 determines that the lead-acid battery 13 is a valve regulated high-grade lead-acid battery. Subsequently, the series of processes illustrated in FIG. 7 are ended.

The operation and advantages of the present embodiment will now be described with reference to FIGS. 8 and 9.

When the onboard lead-acid battery 13 has not still been identified, the series of processes shown in FIG. 7 are executed. In the example of FIG. 9, the internal resistance IR of the lead-acid battery 13 is less than the determination resistance value IRTh. Thus, the charge amount SOC of the lead-acid battery 13 at timing t20 is acquired as the initial capacity IC (1). Then, the fully-charging process is executed. As a result, the execution of the fully-charging process increases the charge amount SOC of the lead-acid battery 13. When the lead-acid battery 13 has become fully charged at timing t21, the execution of the fully-charging process is ended and the discharging process is executed. During the execution period of the discharging process, the charge amount SOC of the lead-acid battery 13 gradually decreases. At timing t22, the decrease amount of the charge amount SOC from timing t21 (i.e., the decrease amount of the charge amount SOC during the execution period of the discharging process) reaches the given amount SSOC. Then, since the state adjustment of the lead-acid battery 13 is completed, the execution of the discharging process is ended and the execution of the determination charging process is started. As a result, the charge amount SOC of the lead-acid battery 13 increases from timing t22. At timing t23, at which the given time Ts has elapsed from timing t22, the execution of the determination charging process is ended. Further, the acceptance amount AC (1) of the lead-acid battery 13 during the execution period of the determination charging process is acquired in association with the initial capacity IC (1).

At this point in time, coefficient N is still 1. Thus, it cannot be identified whether the lead-acid battery 13 is a liquid-type high-grade lead-acid battery or a valve regulated high-grade lead-acid battery.

Thus, in the present embodiment, the above-described series of processes are executed again in another occasion. When the information including the initial capacity IC (2) and the acceptance amount AC (2) associated with the initial capacity IC (2), the information including the initial capacity IC (3) and the acceptance amount AC (3) associated with the initial capacity IC (3), and the information including the initial capacity IC (4) and the acceptance amount AC (4) associated with the initial capacity IC (4) are acquired, the inclination of the approximate straight line indicating the association between the initial capacity IC (N) and the acceptance amount AC (N) associated with the initial capacity IC (N) is calculated. According to whether the inclination of the calculated approximate straight line is positive, it is determined whether the lead-acid battery 13 is a liquid-type high-grade lead-acid battery or a valve regulated high-grade lead-acid battery.

When repeatedly charged and discharged, the liquid-type high-grade lead-acid battery may undergo stratification. Stratification produces layers with a low specific gravity and layers with a high specific gravity of electrolytic solution in a lead-acid battery. When the liquid-type high-grade lead-acid battery undergoes stratification in such a manner, the acceptability of electric charge during charging becomes low. As the amount of charging or discharging in a single time increases, the degree of stratification of the liquid-type high-grade lead-acid battery is likely to become larger. As the degree of stratification becomes larger, the acceptability of electric charge during charging becomes lower. Thus, in a case where the lead-acid battery 13 is a liquid-type high-grade lead-acid battery, when the fully-charging process is executed with a large initial capacity IC and the determination charging process is then executed until the state of the lead-acid battery 13 has entered the given state, the degree of stratification of the lead-acid battery 13 is relatively small. As a result, the acceptance amount AC of the lead-acid battery 13 is relatively large during the execution period of the determination charging process. In contrast, when the fully-charging process is executed with a small initial capacity IC and the determination charging process is then executed until the state of the lead-acid battery 13 has entered the given state, the degree of stratification of the lead-acid battery 13 is relatively large. As a result, the acceptance amount AC of the lead-acid battery 13 is small during the execution period of the determination charging process. That is, as shown by the solid line in FIG. 8, when the lead-acid battery 13 is a liquid-type high-grade lead-acid battery, the acceptance amount AC of the lead-acid battery 13 during the execution period of the determination charging process is likely to decrease as the initial capacity IC decreases.

Unlike the liquid-type high-grade lead-acid battery, a valve regulated high-grade lead-acid battery does not easily undergo stratification when charged and discharged. When the lead-acid battery 13 is a valve regulated high-grade lead-acid battery, as shown by the broken line in FIG. 8, the acceptance amount AC of the lead-acid battery 13 during the execution period of the determination charging process decreases as the initial capacity IC increases.

In the present embodiment, the type of the lead-acid battery 13 is identified using the difference in characteristic between the liquid-type high-grade lead-acid battery and the valve regulated high-grade lead-acid battery. Accordingly, the type of the lead-acid battery 13 can be determined.

In the present embodiment, unlike the first and second embodiments, the type of the lead-acid battery 13 is identified using multiple pieces of information. Thus, the type of the lead-acid battery 13 can be identified accurately as compared with the first and second embodiments.

Fourth Embodiment

A battery type identifying device and a method for identifying a battery type according to a fourth embodiment will now be described with reference to FIGS. 10 to 13. The fourth embodiment differs from the first, second, and third embodiments in the method for identifying the type of the lead-acid battery 13. Accordingly, the difference from the first, second, and third embodiments will mainly be described hereafter, and like or same reference numerals are given to those components that are the same as the corresponding components of the first, second, and third embodiments. Such components will not be described.

Figure 10:
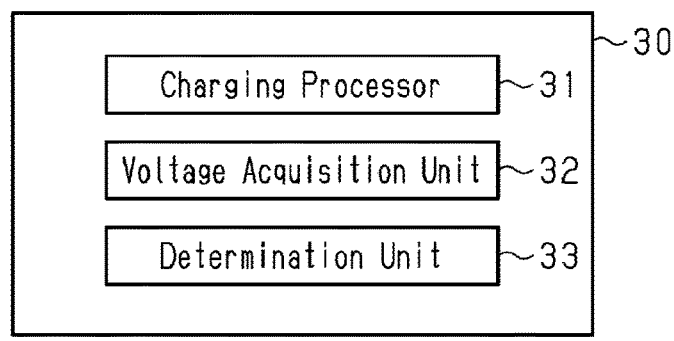
FIG. 10 is a block diagram showing the configuration of the functions of a battery type identifying device according to a fourth embodiment.

As shown in FIG. 10, a battery type identifying device 30 of the present embodiment includes a charging processor 31, a voltage acquisition unit 32, and a determination unit 33 as functional units that identify the type of the lead-acid battery 13.

The charging processor 31 executes a fully-charging process that charges the lead-acid battery 13 so that the lead-acid battery 13 is fully charged. That is, referring to FIG. 11, when starting the fully-charging process, the charging processor 31 monitors the current value Ibt of the lead-acid battery 13. As the state of the lead-acid battery 13 becomes close to the fully-charged state, the current value Ibt starts decreasing instead of increasing. In such a situation where the current value Ibt is decreasing, when the current value Ibt has changed from being greater than a fully-charged determination current value IbtTh2 to being less than or equal to the fully-charged determination current value IbtTh2, it is determined that the lead-acid battery 13 is fully charged. Then, the execution of the fully-charging process is ended.

Figure 11:
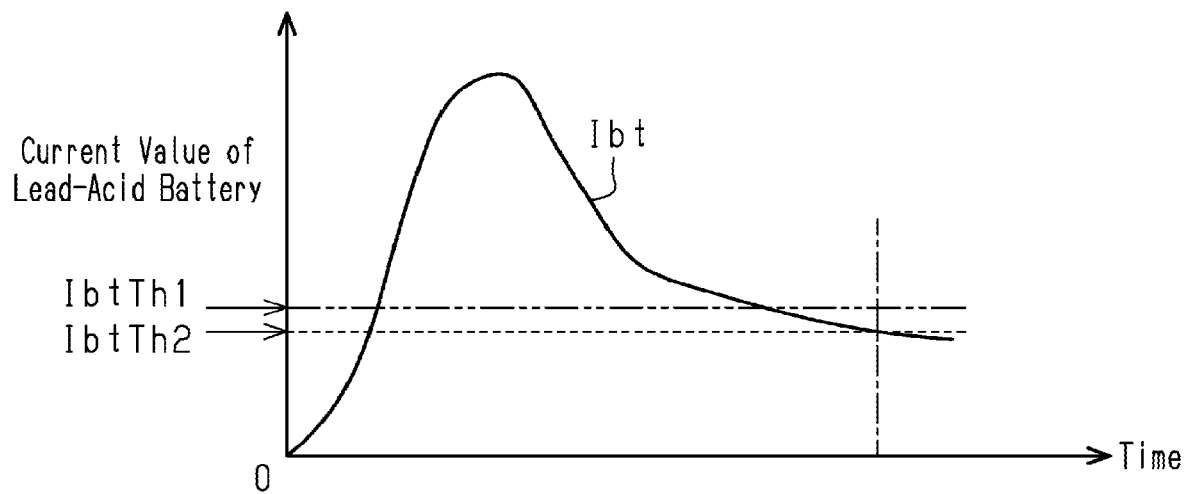
FIG. 11 is a graph showing changes in the value of current flowing through the lead-acid battery when the lead-acid battery is charged.

In FIG. 11, the fully-charged determination current value IbtTh1 in the fully-charging process executed in the first, second, and third embodiments is shown by the long dashed double-short dashed line, and the fully-charged determination current value IbtTh2 in the fully-charging process executed in the present embodiment is shown by the broken line. As shown in FIG. 11, the fully-charged determination current value IbtTh2 is set to be smaller than the fully-charged determination current value IbtTh1.

The voltage acquisition unit 32 acquires an open-circuit voltage OCV of the lead-acid battery 13 when the lead-acid battery 13 has become fully charged by the execution of the charging processor 31.

The determination unit 33 identifies the lead-acid battery 13 using the open-circuit voltage OCV of the lead-acid battery 13, which has been acquired by the voltage acquisition unit 32, and the internal resistance IR of the lead-acid battery 13. More specifically, when the internal resistance IR of the lead-acid battery 13 is greater than or equal to the determination resistance value IRTh, the determination unit 33 determines that the lead-acid battery 13 is a low-grade lead-acid battery. When the open-circuit voltage OCV of the lead-acid battery 13 acquired by the voltage acquisition unit 32 is greater than or equal to a determination voltage OCVTh, the determination unit 33 determines that the lead-acid battery 13 is a valve regulated high-grade lead-acid battery. When the internal resistance IR of the lead-acid battery 13 is less than the determination resistance value IRTh and the open-circuit voltage OCV of the lead-acid battery 13 acquired by the voltage acquisition unit 32 is less than the determination voltage OCVTh, the determination unit 23 determines that the lead-acid battery 13 is a liquid-type high-grade lead-acid battery.

Figure 12:
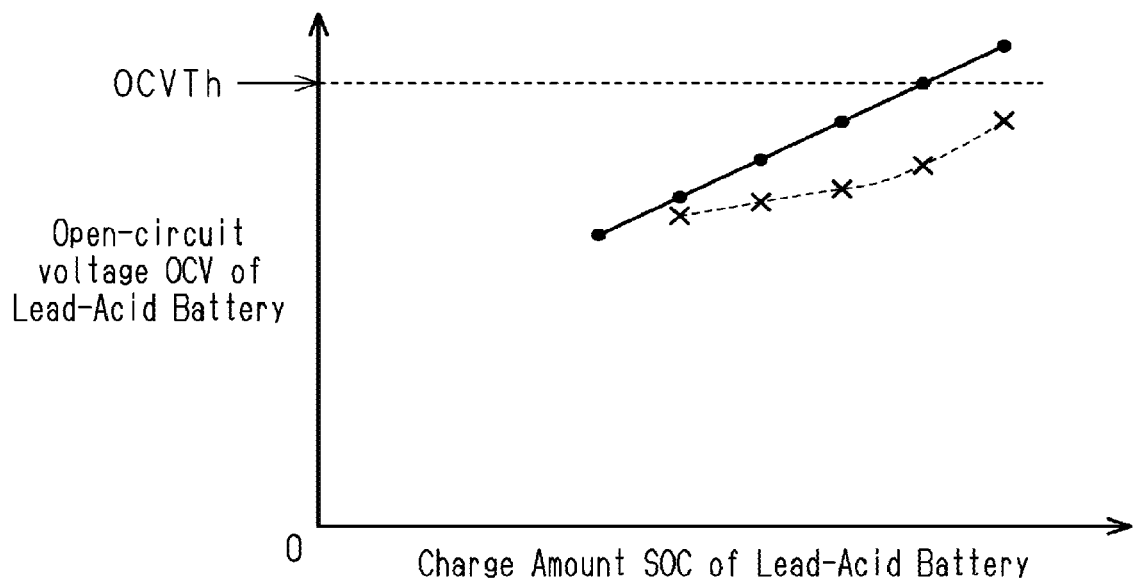
FIG. 12 is a graph showing the relationship between the charge amount of the lead-acid battery and the open-circuit voltage of the lead-acid battery.

In FIG. 12, the solid line shows changes in the open-circuit voltage OCV of the lead-acid battery 13 when the lead-acid battery 13 is a valve regulated high-grade lead-acid battery, and the broken line shows changes in the open-circuit voltage OCV of the lead-acid battery 13 when the lead-acid battery 13 is a liquid-type high-grade lead-acid battery. As shown in FIG. 12, the open-circuit voltage OCV of the valve regulated high-grade lead-acid battery is more likely to increase than the open-circuit voltage OCV of the liquid-type high-grade lead-acid battery. Further, the difference between the open-circuit voltage OCV of the valve regulated high-grade lead-acid battery and the open-circuit voltage OCV of the liquid-type high-grade lead-acid battery increases as the charge amount SOC of the lead-acid battery increases.

The determination voltage OCVTh is set to a value that satisfies the following two conditions.

In a case where the lead-acid battery 13 is a valve regulated high-grade lead-acid battery, the open-circuit voltage OCV when the execution of the fully-charging process is completed does not become less than the determination voltage OCVTh.

In a case where the lead-acid battery 13 is a liquid-type high-grade lead-acid battery, the open-circuit voltage OCV when the execution of the fully-charging process is completed does not become greater than or equal to the determination voltage OCVTh.

Figure 13:
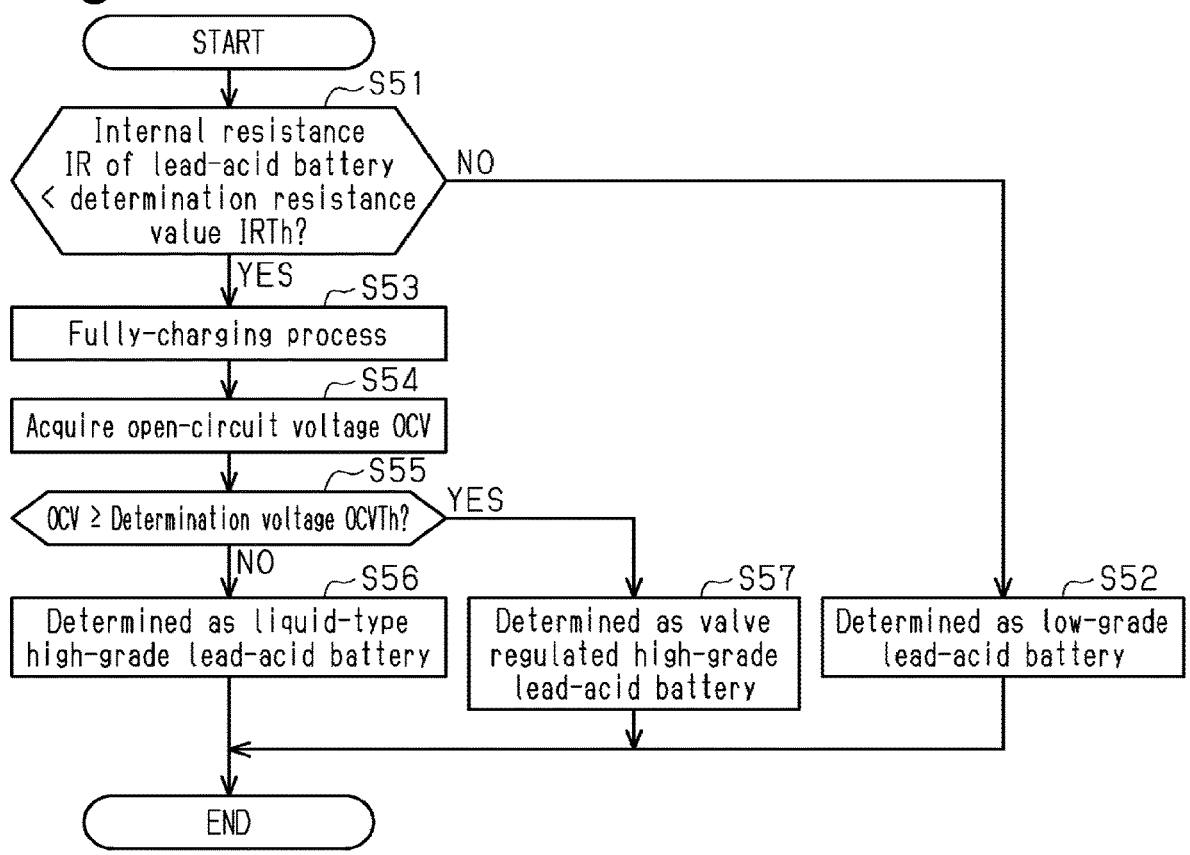
FIG. 13 is a flowchart illustrating the procedure for identifying the type of the lead-acid battery in the battery type identifying device of the fourth embodiment.

The method for identifying the battery type will now be described with reference to FIG. 13. A series of processes illustrated in FIG. 13 are executed by the battery type identifying device 20 when the type of the onboard lead-acid battery 13 has still not been identified. That is, in the present embodiment, the battery type identifying device 20 corresponds to the controller that executes the steps of the method for identifying the battery type.

As shown in FIG. 13, first, in step S51, it is determined whether the internal resistance IR of the lead-acid battery 13 is less than the determination resistance value IRTh. When the internal resistance IR is greater than or equal to the determination resistance value IRTh (S51: NO), the process is advanced to the next step S52. In step S52, the determination unit 33 determines that the lead-acid battery 13 is a low-grade lead-acid battery. Subsequently, the series of processes illustrated in FIG. 13 are ended.

In step S51, when the internal resistance JR of the lead-acid battery 13 is less than the determination resistance value IRTh (YES), it is determined that the lead-acid battery 13 is a high-grade lead-acid battery. Thus, the process is advanced to the next step S53. In step S53, the charging processor 31 executes the fully-charging process. That is, in the present embodiment, step S53 corresponds to a step that fully charges the lead-acid battery 13.

When the execution of the fully-charging process is ended, the process is advanced to the next step S54. In step S54, the voltage acquisition unit 32 acquires the open-circuit voltage OCV of the lead-acid battery 13. That is, in the present embodiment, step S54 corresponds to a step that acquires the open-circuit voltage OCV of the lead-acid battery 13 when the lead-acid battery 13 has become fully charged. Then, in the next step S55, the determination unit 33 determines whether the open-circuit voltage OCV is greater than or equal to the determination voltage OCVTh.

When the open-circuit voltage OCV is less than the determination voltage OCVTh (S55: NO), the process is advanced to the next step S56. In step S56, the determination unit 33 determines that the lead-acid battery 13 is a liquid-type high-grade lead-acid battery. Subsequently, the series of processes illustrated in FIG. 13 are ended.

In step S55, when the open-circuit voltage OCV is greater than or equal to the determination voltage OCVTh (YES), the process is advanced to the next step S57. In step S57, the determination unit 33 determines that the lead-acid battery 13 is a valve regulated high-grade lead-acid battery. That is, in the present embodiment, steps S55 and S57 are examples of the step that determines the lead-acid battery 13 is a valve regulated high-grade lead-acid battery when the acquired open-circuit voltage OCV of the lead-acid battery 13 is greater than or equal to the determination voltage OCVTh. Subsequently, the series of processes illustrated in FIG. 13 are ended.

The operation and advantages of the present embodiment will now be described.

In a case where the open-circuit voltage OCV of the lead-acid battery 13 when the lead-acid battery 13 has become fully charged by the execution of the fully-charging process is greater than or equal to the determination voltage OCVTh, it is determined that the lead-acid battery 13 is a valve regulated high-grade lead-acid battery. In a case where the open-circuit voltage OCV of the lead-acid battery 13 when the lead-acid battery 13 has become fully charged by the execution of the fully-charging process is less than the determination voltage OCVTh and the internal resistance IR of the lead-acid battery 13 is less than the determination resistance value IRTh, it is determined that the lead-acid battery 13 is a liquid-type high-grade lead-acid battery.

Accordingly, it is accurately determined whether the lead-acid battery 13 is a valve regulated high-grade lead-acid battery without using the charge-discharge capacity of the lead-acid battery 13.

Fifth Embodiment

A battery type identifying device and a method for identifying a battery type according to a fifth embodiment will now be described with reference to FIGS. 14 to 18. The fifth embodiment differs from the first embodiment in some of the procedure for identifying the type of the lead-acid battery 13. Accordingly, the difference from the first embodiment will mainly be described hereafter, and like or same reference numerals are given to those components that are the same as the corresponding components of the first embodiment. Such components will not be described.

Figure 14:
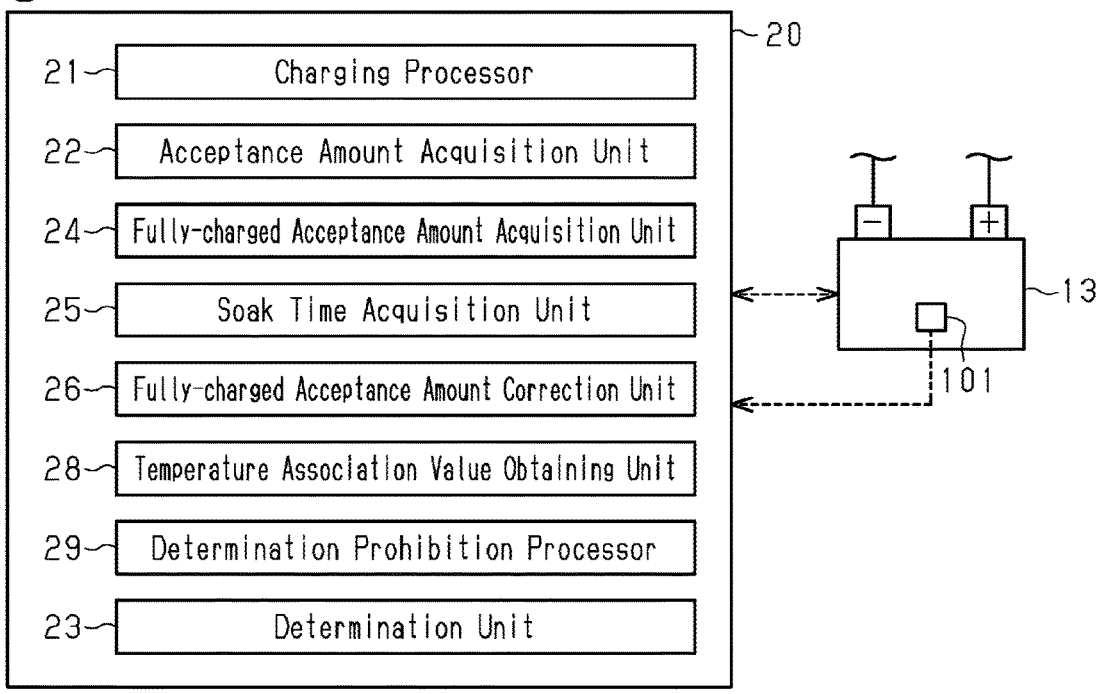
FIG. 14 is a block diagram showing the configuration of the functions of a battery type identifying device according to a fifth embodiment and the onboard lead-acid battery.

The configuration of the functions of the battery type identifying device 20 in the present embodiment will now be described with reference to FIG. 14.

In addition to the charging processor 21, the acceptance amount acquisition unit 22, and the determination unit 23, the battery type identifying device 20 includes a fully-charged acceptance amount acquisition unit 24, a soak time acquisition unit 25, a fully-charged acceptance amount correction unit 26, a temperature association value obtaining unit 28, and a determination prohibition processor 29.

The fully-charged acceptance amount acquisition unit 24 acquires the acceptance amount of the lead-acid battery 13 during the execution period of the fully-charging process as a fully-charged acceptance amount ACF. The fully-charged acceptance amount ACF refers to the amount of the charge amount SOC of the lead-acid battery 13 increased through the execution of the fully-charging process. The fully-charged acceptance amount ACF can be calculated using the value of current flowing through the lead-acid battery 13 during the execution of the fully-charging process. Thus, the fully-charged acceptance amount acquisition unit 24 detects the value of current flowing through the lead-acid battery 13 during the execution of the fully-charging process to calculate the fully-charged acceptance amount ACF.

The soak time acquisition unit 25 acquires a soak time TIMSK when a vehicle operation is started. The soak time TIMSK refers to the elapsed time from the end of a vehicle operation when the previous fully-charging process was executed to the beginning of the current vehicle operation in a case where the fully-charging process was executed during a vehicle operation prior to the current vehicle operation.

At the beginning of the vehicle operation, the operating switch of the vehicle is activated so that the vehicle is able to travel. At the end of the vehicle operation, the operating switch of the vehicle is inactivated so that the vehicle is unable to travel.

The fully-charged acceptance amount correction unit 26 uses the soak time TIMSK to correct a previous value ACFb of the fully-charged acceptance amount, which is the fully-charged acceptance amount ACF acquired through the execution of the previous fully-charging process, so that the previous value ACFb is decreased. Then, the fully-charged acceptance amount correction unit 26 sets the previous value ACFb subsequent to the decreasing correction as the corrected previous value ACFb. The correction of the previous value ACFb will be described later.

The temperature association value obtaining unit 28 obtains a battery liquid temperature TMP, which is the temperature of a liquid in the lead-acid battery 13, as a temperature association value that increases as the temperature of the lead-acid battery increases. The battery liquid temperature TMP is a sensor value based on a detection signal from a temperature sensor 101, which is incorporated in the lead-acid battery 13. The temperature association value obtaining unit 28 may obtain a value that differs from the battery liquid temperature TMP as long as that value is a temperature association value of the lead-acid battery 13. For example, the value that differs from the battery liquid temperature TMP includes a temperature estimation value of the lead-acid battery 13 calculated using the temperature of the setting environment of the lead-acid battery 13.

The determination prohibition processor 29 prohibits a determination as to whether the lead-acid battery 13 is a high-grade lead-acid battery when a predetermined determination prohibition condition is satisfied during a period until the lead-acid battery 13 is exchanged. The predetermined determination prohibition condition will be described later.

Figure 15:
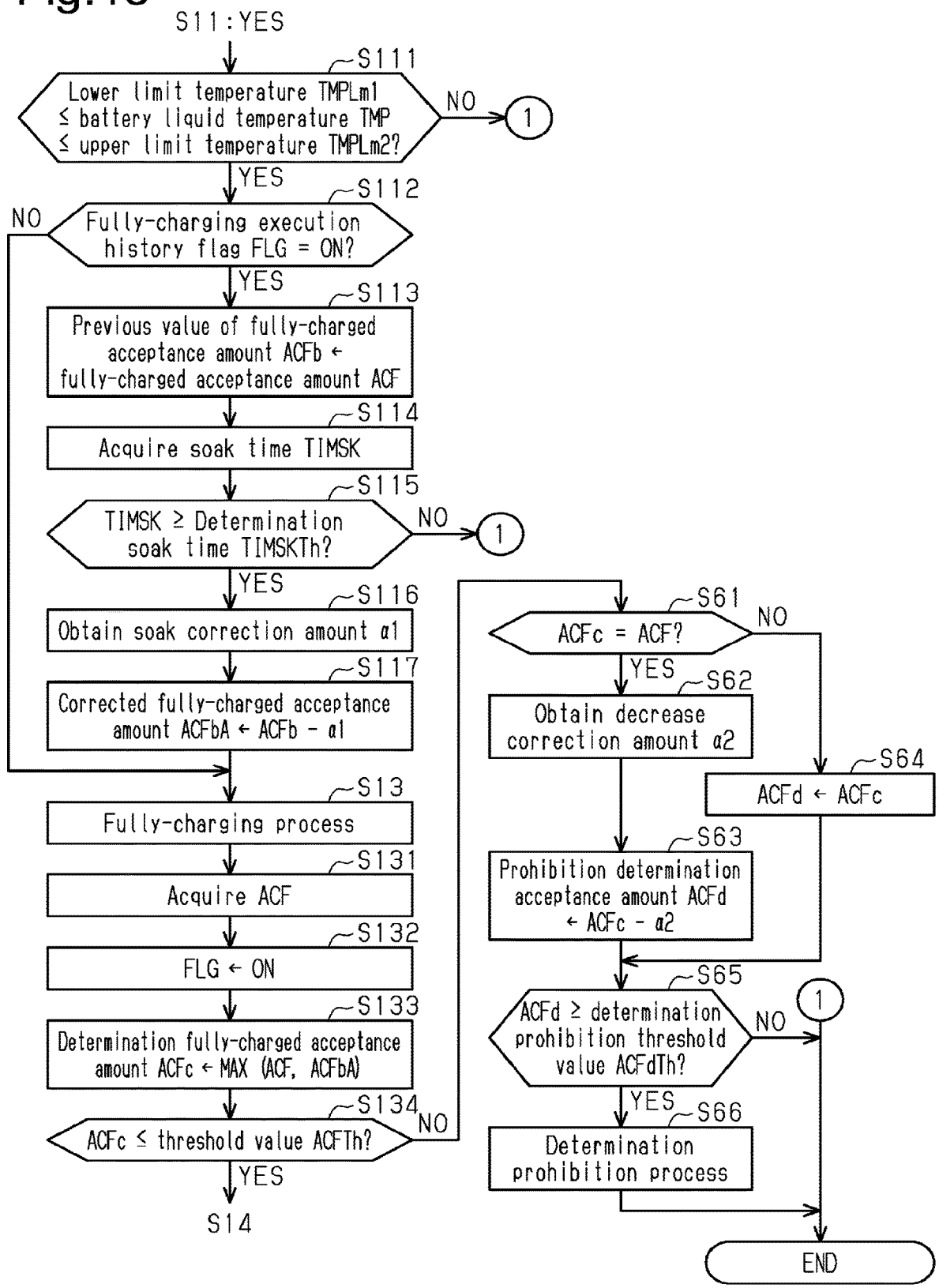
FIG. 15 is a flowchart illustrating some of the procedure for identifying the type of the lead-acid battery in the battery type identifying device of the fifth embodiment.

The method for identifying the battery type will now be described with reference to FIGS. 15, 16, and 17. FIG. 15 illustrates part of a series of processes for identifying a battery type. In the present embodiment, when the type of the onboard lead-acid battery 13 has still not been identified since the beginning of the vehicle operation, the battery type identifying device 20 executes the series of processes. That is, in the present embodiment, the battery type identifying device 20 corresponds to the controller that executes the steps of the method for identifying the battery type.

In the present embodiment, as will be described in detail later, in some cases, the type of the lead-acid battery 13 is not determined even if the series of processes are executed. In these cases, the series of processes are not executed until the next vehicle operation is started. That is, during a period from when the lead-acid battery 13 is exchanged to when the determination of the type of the lead-acid battery 13 is completed, the series of processes are executed every time a vehicle operation is started.

Further, as will be described in detail later, in some cases, a battery type identification prohibition flag is set to ON by executing the series of processes. When the battery type identification prohibition flag is set to ON, the determination of the type of the lead-acid battery 13 through the execution of the series of processes is prohibited. Thus, when the battery type identification prohibition flag is set to ON, the series of processes are not executed even if a vehicle operation is started. When the lead-acid battery 13 is removed from the vehicle, the battery type identification prohibition flag is set to OFF. When the battery type identification prohibition flag is set to OFF in such a manner, the prohibition of the series of processes is cancelled when the next vehicle operation is started.

In the first step S11, it is determined whether the internal resistance IR of the lead-acid battery 13 is less than the determination resistance value IRTh. When the internal resistance IR is less than the determination resistance value IRTh (S11: YES), the process is advanced to the next step S111. In step S111, it is determined whether the battery liquid temperature TMP is within a predetermined temperature range in which the lower limit is a lower limit temperature TMPLm1 and the upper limit is an upper limit temperature TMPLm2. The predetermined temperature range is set as a reference for determining whether the type of the lead-acid battery 13 can be identified accurately. When the battery liquid temperature TMP is not within the battery liquid temperature TMP, the accuracy of the determination is low. Thus, when the battery liquid temperature TMP is less than the lower limit temperature TMPLm1 or the battery liquid temperature TMP is higher than the upper limit temperature TMPLm2 (S111: NO), the battery liquid temperature TMP is not within the predetermined temperature range. Thus, the series of processes shown in FIG. 15 are ended.

When the battery liquid temperature TMP is greater than or equal to the lower limit temperature TMPLm1 and less than or equal to the upper limit temperature TMPLm2 (S111: YES), the process is advanced to the next step S112. In step S112, it is determined whether a fully-charging execution history flag FLG (described later) is set to ON. In a case where the fully-charging process has been executed even once after the exchange of the lead-acid battery 13, the fully-charging execution history flag FLG is set to ON. In a case where the fully-charging process has not been executed even once after the exchange of the lead-acid battery 13, the fully-charging execution history flag FLG is set to OFF. When the fully-charging execution history flag FLG is set to OFF (S112: NO), the process is advanced to the next step S13.

When the fully-charging execution history flag FLG is set to ON (S112: YES), the process is advanced to the next step S113. The fully-charging execution history flag FLG being set to ON means that the fully-charging process in step S13 (described below) has been executed since the mounting of the lead-acid battery 13 on the vehicle. This fully-charging process is the same process as the fully-charging process in the first embodiment. In step S113, the fully-charged acceptance amount ACF acquired by the fully-charged acceptance amount acquisition unit 24 through the execution of the previous fully-charging process is acquired as the previous value ACFb of the fully-charged acceptance amount. Subsequently, in the next step S114, the soak time acquisition unit 25 acquires, as the soak time TIMSK, the elapsed time from the end of the vehicle operation during the execution of the previous fully-charging process to the beginning of the current vehicle operation.

In step S115, it is determined whether the acquired soak time TIMSK is greater than or equal to a determination soak time TIMSKTh. The determination soak time TIMSKTh is a reference for determining whether the soak time TIMSK is long. When the lead-acid battery 13 is a liquid-type high-grade lead-acid battery, the lead-acid battery 13 has undergone stratification in a case where the acceptance amount was large during the execution of the previous fully-charging process. The stratification of the lead-acid battery 13 is eliminated after the elapse of a certain time. In the present embodiment, when the soak time TIMSK is greater than or equal to the determination soak time TIMSKTh, it is determined that stratification has been eliminated to some extent even if the stratification occurred due to the execution of the previous fully-charging process. When the soak time TIMSK is less than the determination soak time TIMSKTh, it is determined that stratification of the lead-acid battery 13 resulting from the execution of the previous fully-charging process has not been eliminated sufficiently. Thus, when the soak time TIMSK is less than the determination soak time TIMSKTh (S115: NO), the series of processes shown in FIG. 15 are ended.

When the soak time TIMSK is greater than or equal to the determination soak time TIMSKTh (S115: YES), the process is advanced to the next step S116. In step S116, the fully-charged acceptance amount correction unit 26 obtains a soak correction amount $\alpha 1$. The soak correction amount $\alpha 1$ is obtained using the battery liquid temperature TMP. In the present embodiment, the soak correction amount $\alpha 1$ increases as the battery liquid temperature TMP increases. For example, the fully-charged acceptance amount correction unit 26 uses the table in FIG. 16 to obtain the soak correction amount $\alpha 1$.

The table in FIG. 16 shows the relationship between multiple regions of the battery liquid temperature TMP and soak correction amounts $\alpha 1$ respectively corresponding to the regions. A first liquid temperature TMP1 and a second limit temperature TMP2 are higher than the lower limit temperature TMPLm1 and lower than the upper limit temperature TMPLm2. The second limit temperature TMP2 is higher than the first liquid temperature TMP1. When the battery liquid temperature TMP is less than the first liquid temperature TMP1, the soak correction amount $\alpha 1$ is a first value Z1. When the battery liquid temperature TMP is greater than or equal to the first liquid temperature TMP1 and is less than the second limit temperature TMP2, the soak correction amount $\alpha 1$ is a second value Z2. When the battery liquid temperature TMP is greater than or equal to the second limit temperature TMP2, the soak correction amount $\alpha 1$ is a third value Z3. The second value Z2 is larger than the first value Z1. The third value Z3 is larger than the second value Z2.

Referring back to FIG. 15, when the soak correction amount $\alpha 1$ is obtained in step S116, the process is advanced to the next step S117. In step S117, the fully-charged acceptance amount correction unit 26 calculates, as a corrected fully-charged acceptance amount ACFbA, a value obtained by subtracting the soak correction amount $\alpha 1$ from the previous value ACFb of the fully-charged acceptance amount. That is, when the soak time TIMSK is greater than or equal to the determination soak time TIMSKTh, the previous value ACFb of the fully-charged acceptance amount is corrected so that the previous value ACFb decreases, and the previous value ACFb subsequent to the decreasing correction is obtained as the corrected fully-charged acceptance amount ACFbA. In addition, this decrease correction amount increases as the battery liquid temperature TMP increases. When the corrected fully-charged acceptance amount ACFbA is calculated in such a manner, the process is advanced to the next step S13.

In step S13, the charging processor 21 executes the above-described fully-charging process. When the execution of the fully-charging process is ended, the process is advanced to the next step S131. In step S131, the fully-charged acceptance amount acquisition unit 24 acquires, as the fully-charged acceptance amount ACF, the acceptance amount of the lead-acid battery 13 during the execution period of the fully-charging process. In the present embodiment, the fully-charged acceptance amount ACF acquired in step S131 corresponds to the latest value of the fully-charged acceptance amount. Subsequently, in the next step S132, the fully-charging execution history flag FLG is set to ON.

Then, in step S133, the corrected fully-charged acceptance amount ACFbA and the fully-charged acceptance amount ACF are used to obtain a determination fully-charged acceptance amount ACFc. When the corrected fully-charged acceptance amount ACFbA is calculated during the current execution of the series of processes shown in FIG. 15, the larger one of the corrected fully-charged acceptance amount ACFbA and the fully-charged acceptance amount ACF is obtained as the determination fully-charged acceptance amount ACFc. Further, when the corrected fully-charged acceptance amount ACFbA is equal to the fully-charged acceptance amount ACF, the fully-charged acceptance amount ACF is obtained as the determination fully-charged acceptance amount ACFc. When the corrected fully-charged acceptance amount ACFbA is not calculated during the current execution of the series of processes shown in FIG. 15, the fully-charged acceptance amount ACF is obtained as the determination fully-charged acceptance amount ACFc.

Subsequently, in step S134, the determination unit 23 determines whether the determination fully-charged acceptance amount ACFc is less than or equal to a threshold value ACFTh. In a case where the lead-acid battery 13 is a high-grade lead-acid battery, the lead-acid battery 13 may undergo stratification when charged and discharged. In particular, the degree of stratification increases as the amount of the charge amount SOC that is increased through the execution of the fully-charging process becomes larger. That is, it is predicted that the degree of stratification of the lead-acid battery 13 increases as the determination fully-charged acceptance amount ACFc increases. Thus, in the present embodiment, the threshold value ACFTh is set as a reference for determining whether the degree of stratification of the lead-acid battery 13 is large using the determination fully-charged acceptance amount ACFc. Thus, when the determination fully-charged acceptance amount ACFc is larger than the threshold value ACFTh, the degree of stratification of the lead-acid battery 13 is likely to be large. When the determination fully-charged acceptance amount ACFc is less than or equal to the threshold value ACFTh, it is determined that the degree of stratification of the lead-acid battery 13 is within an allowable range.

When the determination fully-charged acceptance amount ACFc is less than or equal to the threshold value ACFTh (S134: YES), the process is advanced to the next step S14. That is, as described in the above-described first embodiment, it is determined whether the lead-acid battery 13 is a liquid-type high-grade lead-acid battery. When the determination fully-charged acceptance amount ACFc is larger than the threshold value ACFTh (S134: NO), the determination as to whether the lead-acid battery 13 is a liquid-type high-grade lead-acid battery is not made and the process is advanced to the next step S61.

In step S61, it is determined whether the determination fully-charged acceptance amount ACFc is equal to the fully-charged acceptance amount ACF acquired in step S31. When it is determined that the determination fully-charged acceptance amount ACFc is equal to the fully-charged acceptance amount ACF (S131: YES), the process is advanced to the next step S62. In step S62, the determination prohibition processor 29 obtains a decrease correction amount $\alpha 2$. The decrease correction amount $\alpha 2$ is obtained using the battery liquid temperature TMP. In the present embodiment, the decrease correction amount $\alpha 2$ increases as the battery liquid temperature TMP increases. For example, the determination prohibition processor 29 uses the table in FIG. 17 to obtain the decrease correction amount $\alpha 2$.

The table in FIG. 17 shows the relationship between multiple regions of the battery liquid temperature TMP and decrease correction amounts $\alpha 2$ respectively corresponding to the regions. A first liquid temperature TMP11 and a second limit temperature TMP12 are higher than the lower limit temperature TMPLm1 and lower than the upper limit temperature TMPLm2. The second limit temperature TMP12 is higher than the first liquid temperature TMP11. When the battery liquid temperature TMP is less than the first liquid temperature TMP11, the decrease correction amount $\alpha 2$ is a first value Z11. When the battery liquid temperature TMP is greater than or equal to the first liquid temperature TMP11 and is less than the second limit temperature TMP12, the decrease correction amount $\alpha 2$ is a second value Z12. When the battery liquid temperature TMP is greater than or equal to the second limit temperature TMP12, the decrease correction amount $\alpha 2$ is a third value Z13. The second value Z12 is larger than the first value Z11. The third value Z13 is larger than the second value Z12.

Referring back to FIG. 15, when the decrease correction amount $\alpha 2$ is obtained in step S62, the process is advanced to the next step S63. In step S63, the determination prohibition processor 29 calculates, as a prohibition determination acceptance amount ACFd, a value obtained by subtracting the decrease correction amount $\alpha 2$ from the determination fully-charged acceptance amount ACFc. That is, in the present embodiment, when the fully-charged acceptance amount ACF is greater than or equal to the corrected fully-charged acceptance amount ACFbA, the fully-charged acceptance amount ACF is corrected so that its value decreases as the battery liquid temperature TMP increases, and the corrected fully-charged acceptance amount ACF is acquired as the prohibition determination acceptance amount ACFd. When the prohibition determination acceptance amount ACFd is calculated, the process is advanced to the next step S65.

When the lead-acid battery 13 is a liquid-type high-grade lead-acid battery, stratification of the lead-acid battery 13 is eliminated to some extent after the elapse of time even if the stratification of the lead-acid battery 13 occurred due to the execution of the fully-charging process. In addition, the elimination degree of the stratification increases as the battery liquid temperature TMP increases. The decrease correction amount $\alpha 2$ increases as the battery liquid temperature TMP increases. Thus, the prohibition determination acceptance amount ACFd, which is a value obtained by subtracting the decrease correction amount $\alpha 2$ from the fully-charged acceptance amount ACF, has a certain correlation with the degree of a future stratification. When the degree of stratification of the lead-acid battery 13 is excessively large, the stratification is virtually unable to be eliminated. In a case where the stratification is virtually unable to be eliminated, it is difficult to make an accurate determination even if the determination is made for the lead-acid battery 13 as to whether the lead-acid battery 13 is a liquid-type high-grade lead-acid battery.

In step S61, when the determination fully-charged acceptance amount ACFc is not equal to the fully-charged acceptance amount ACF (NO), the determination fully-charged acceptance amount ACFc is the corrected fully-charged acceptance amount ACFbA. Thus, the process is advanced to the next step S64. In step S64, the determination fully-charged acceptance amount ACFc is obtained as the prohibition determination acceptance amount ACFd. Then, the process is advanced to the next step S65.

In step S65, the determination prohibition processor 29 determines whether the prohibition determination acceptance amount ACFd is greater than or equal to an identification prohibition threshold value ACFdTh. The identification prohibition threshold value ACFdTh is set as a reference for determining whether the degree of stratification of the lead-acid battery 13 has become so large that the stratification is unable to be eliminated. More specifically, the identification prohibition threshold value ACFdTh is larger than the threshold value ACFTh. When the prohibition determination acceptance amount ACFd is less than the identification prohibition threshold value ACFdTh (S65: NO), the series of processes shown in FIG. 15 are ended. When both the determination in step S134 and the determination in step S65 are NO and the series of processes are ended, the series of processes will not be executed again during the current vehicle operation.

In step S65, when the prohibition determination acceptance amount ACFd is greater than or equal to the identification prohibition threshold value ACFdTh (YES), it is determined that the above-described determination prohibition condition has been satisfied. Thus, the process is advanced to the next step S66. In step S66, the determination prohibition processor 29 executes a determination prohibiting process. The determination prohibiting process is a process that prohibits the determination as to whether the lead-acid battery 13 is a liquid-type high-grade lead-acid battery during a period until the lead-acid battery 13 is exchanged. In the determination prohibiting process executed in the present embodiment, the above-described battery type identification prohibition flag is set to ON. The battery type identification prohibition flag is a flag that determines whether to prohibit the series of processes that determine the type of the lead-acid battery 13 even is the vehicle operation is started. Then, the series of processes illustrated in FIG. 15 are ended.

When the battery type identification prohibition flag is set to ON, the lead-acid battery 13 may be regarded as a type of the lead-acid battery that is set as a parameter (for example, liquid-type high-grade lead-acid battery) to control the vehicle. Alternatively, when the battery type identification prohibition flag is set to ON, the idling stop function may be stopped.

In the present embodiment, the identification prohibition threshold value ACFdTh varies in correspondence with the battery liquid temperature TMP. That is, the identification prohibition threshold value ACFdTh increases as the battery liquid temperature TMP increases. For example, the table in FIG. 18 is used to set the identification prohibition threshold value ACFdTh. The table in FIG. 18 shows the relationship between multiple regions of the battery liquid temperature TMP and identification prohibition threshold values ACFdTh respectively corresponding to the regions. A first liquid temperature TMP21 and a second limit temperature TMP22 are higher than the lower limit temperature TMPLm1 and lower than the upper limit temperature TMPLm2. The second limit temperature TMP22 is higher than the first liquid temperature TMP21. When the battery liquid temperature TMP is less than the first liquid temperature TMP21, the identification prohibition threshold value ACFdTh is a first value Z21. When the battery liquid temperature TMP is greater than or equal to the first liquid temperature TMP21 and is less than the second limit temperature TMP22, the identification prohibition threshold value ACFdTh is a second value Z22. When the battery liquid temperature TMP is greater than or equal to the second limit temperature TMP22, the identification prohibition threshold value ACFdTh is a third value Z23. The second value Z22 is larger than the first value Z21. The third value Z23 is larger than the second value Z22.

In the present embodiment, the advantages described below can be obtained in addition to the advantages of the first embodiment.

(1) When the liquid-type high-grade lead-acid battery is mounted on the vehicle as the lead-acid battery 13, it is determined that the degree of stratification of the lead-acid battery 13 through the execution of the fully-charging process increases as the fully-charged acceptance amount ACF increases. Thus, when the fully-charged acceptance amount ACF is greater than or equal to the threshold value ACFTh, it is determined that the degree of stratification that occurs through the execution of the fully-charging process is large and the fully-charged acceptance amount ACF is greatly affected by the stratification. Thus, the determination as to whether the lead-acid battery 13 is a liquid-type high-grade lead-acid battery is not made. This limits decreases in the accuracy of the determination. Further, for example, the adjustment of the charge amount of the lead-acid battery 13 using the result of an erroneous determination is limited.

(2) In the present embodiment, when the soak time TIMSK is greater than or equal to the determination soak time TIMSKTh, it is determined that the time is long to some extent from the end of the vehicle operation in which the previous fully-charging process was executed to the beginning of the current vehicle operation. That is, even if the liquid-type high-grade lead-acid battery is mounted on the vehicle as the lead-acid battery 13, the stratification of the lead-acid battery 13 that occurred through the execution of the previous fully-charging process is eliminated to some extent. Thus, the previous value ACFb of the fully-charged acceptance amount is corrected so that the previous value ACFb decreases, and the previous value ACFb subsequent to the decreasing correction is calculated as the corrected fully-charged acceptance amount ACFbA. When the liquid-type high-grade lead-acid battery is mounted as the lead-acid battery 13, the corrected fully-charged acceptance amount ACFbA calculated in such a manner correlates with the degree of stratification of the lead-acid battery 13 at the point in time the current vehicle operation is started.

The fully-charged acceptance amount ACF correlates with the stratification resulting from the execution of the fully-charging process of the current vehicle operation.

Even if the acceptance amount of the lead-acid battery 13 through the execution of the current fully-charging process during the current vehicle operation is small, when the acceptance amount of the lead-acid battery 13 through the execution of the previous vehicle operation was large, the degree of stratification of the lead-acid battery 13 is predicted to be large at the point in time the current vehicle operation is started. In this case, it is desired that the determination as to whether the lead-acid battery 13 is a liquid-type high-grade lead-acid battery be made by taking into account the degree of stratification of the lead-acid battery at the point in time the current vehicle operation is started. Thus, in the present embodiment, when the corrected fully-charged acceptance amount ACFbA is larger than the fully-charged acceptance amount ACF, the corrected fully-charged acceptance amount ACFbA is used to determine whether to make the determination.

Even if the acceptance amount of the lead-acid battery 13 through the execution of the previous fully-charging process was small, when the acceptance amount of the lead-acid battery 13 through the execution of the current vehicle operation is large, the degree of stratification of the lead-acid battery 13 is predicted to be large at the point in time the current fully-charging process is ended. In this case, it is desired to determine whether the determination be made by taking into account the degree of stratification of the lead-acid battery at the point in time the current fully-charging process is ended. Thus, in the present embodiment, when the fully-charged acceptance amount ACF is greater than or equal to the corrected fully-charged acceptance amount ACFbA, the fully-charged acceptance amount ACF is used to determine whether to determine whether the lead-acid battery 13 is a high-grade lead-acid battery.

More specifically, the determination as to whether the lead-acid battery 13 is a liquid-type high-grade lead-acid battery can be made using one of the fully-charged acceptance amount ACF and the corrected fully-charged acceptance amount ACFbA that has a higher correlation with the degree of stratification of the lead-acid battery 13 at the point in time the execution of the fully-charging process is ended during the current vehicle operation.

(3) When the soak time TIMSK is less than the determination soak time TIMSKTh, it is determined that the time from the end of the vehicle operation in which the previous fully-charging process was executed to the beginning of the current vehicle operation is short. When the high-grade lead-acid battery is mounted on the vehicle as the lead-acid battery 13, the degree of stratification of the lead-acid battery 13 is likely to still be large. Thus, when the soak time TIMSK is less than the determination soak time TIMSKTh, the determination as to whether the lead-acid battery 13 is a liquid-type high-grade lead-acid battery is not made during the current vehicle operation. Accordingly, the determination as to whether the lead-acid battery 13 is a liquid-type high-grade lead-acid battery is prevented from being executed when the degree of stratification of the lead-acid battery 13 is likely to still be large.

Further, when the soak time TIMSK is less than the determination soak time TIMSKTh, the fully-charging process is not executed during the current vehicle operation. This limits unnecessary execution of the fully-charging process and thus limits the expedition of the deterioration of the lead-acid battery 13.

(4) In a case where the liquid-type high-grade lead-acid battery is mounted on the vehicle as the lead-acid battery 13, when the corrected fully-charged acceptance amount ACFbA is larger than the fully-charged acceptance amount ACF and the corrected fully-charged acceptance amount ACFbA is greater than or equal to the identification prohibition threshold value ACFdTh, the elimination of the stratification of the lead-acid battery 13 is determined as being difficult. Thus, the determination is not made during a period until the lead-acid battery 13 mounted on the vehicle is exchanged. As a result, the series of processes shown in FIG. 15 every time the vehicle operation is started is prevented from being executed when an accurate determination may not able to be made. That is, an increase in the control load of the battery type identifying device 20 is limited.

(5) When the lead-acid battery 13 is a high-grade lead-acid battery, stratification is eliminated to some extent after the elapse of time as described above. When the fully-charged acceptance amount ACF is corrected using the battery liquid temperature TMP so that the amount decreases, the fully-charged acceptance amount ACF subsequent to the decreasing correction is a correlation value of the degree of stratification at the point in time a certain time has elapsed. When the fully-charged acceptance amount ACF subsequent to the decreasing correction is greater than or equal to the identification prohibition threshold value ACFdTh, the elimination of stratification is determined as being difficult. Thus, the determination is not made during a period until the lead-acid battery 13 mounted on the vehicle is exchanged. As a result, the series of processes shown in FIG. 15 every time the vehicle operation is started is prevented from being executed when an accurate determination may not able to be made. That is, an increase in the control load of the battery type identifying device 20 is limited.

(6) Additionally, when the battery type identification prohibition flag is set to ON, the fully-charging process is not executed until the lead-acid battery 13 is executed. This limits the repetition of charging and discharging of the lead-acid battery 13 and thus limits the expedition of the degradation of the lead-acid battery 13.

The above-described embodiments may be modified as follows. The above-described embodiments and the following modifications can be combined as long as the combined modifications remain technically consistent with each other.

In the fifth embodiment, the prohibition determination acceptance amount ACFd does not have to be varied using the battery liquid temperature TMP.

In the fifth embodiment, the decrease correction amount α2 does not have to be varied using the battery liquid temperature TMP. That is, the decrease correction amount α2 may be held using a value that has been set in advance.

In the fifth embodiment, when the determination fully-charged acceptance amount ACFc is equal to the fully-charged acceptance amount ACF, the fully-charged acceptance amount ACF that has not undergone the decreasing correction may be obtained as the prohibition determination acceptance amount ACFd.

In the fifth embodiment, the soak correction amount α1 does not have to be varied using the battery liquid temperature TMP.

In the fourth embodiment, in a case where the open-circuit voltage OCV of the lead-acid battery 13 is less than the determination voltage OCVTh when the lead-acid battery 13 has become fully charged through the execution of the fully-charging process, it may be determined whether the internal resistance IR of the lead-acid battery 13 is less than the determination resistance value IRTh. This modification has the same advantage as that of the fourth embodiment.

In the fourth embodiment, as long as it is possible to determine whether the lead-acid battery 13 is a valve regulated high-grade lead-acid battery, the determination as to whether the internal resistance IR of the lead-acid battery 13 is less than the determination resistance value IRTh may be omitted. That is, when the lead-acid battery 13 is not a valve regulated high-grade lead-acid battery, the identification as to whether the lead-acid battery 13 is a liquid-type high-grade lead-acid battery or a low-grade lead-acid battery does not have to be done.

In the fourth embodiment, as long as whether the lead-acid battery 13 is a valve regulated high-grade lead-acid battery can be determined by comparing the open-circuit voltage OCV and the determination voltage OCVTh of the lead-acid battery 13 when the lead-acid battery 13 has become fully charged through the execution of the fully-charging process, the fully-charged determination current value IbtTh2 may be set to be equal to the fully-charged determination current value IbtTh1 or the fully-charged determination current value IbtTh2 may be set to be larger than the fully-charged determination current value IbtTh1.

In the third embodiment, when four pieces of information including the initial capacity IC and the acceptance amount AC associated with the initial capacity IC are acquired, these four pieces of information are used to calculate the inclination of an approximate straight line. Instead, the number of the information acquired to calculate the inclination of an approximate straight line does not have to be four (may be, for example three) as long as the number is greater than or equal to two.

In the third embodiment, when the inclination of the approximate straight line is not positive in step S41 (NO), it may be determined whether the internal resistance JR of the lead-acid battery 13 is less than the determination resistance value IRTh. This modification has the same advantage as that of the third embodiment.

In the third embodiment, when the fully-charged acceptance amount ACF, which is the acceptance amount of the lead-acid battery 13 during the execution period of the fully-charging process, is acquired and the fully-charged acceptance amount ACF is greater than or equal to the threshold value ACFTh, the series of processes shown in FIG. 7 may be ended without executing the processes subsequent to step S36. In this case, the series of processes shown in FIG. 7 are prohibited from being executed during a vehicle operation in which the fully-charging process is executed such that the fully-charged acceptance amount ACF becomes greater than or equal to the threshold value ACFTh.

Further, in the third embodiment, when the soak time TIMSK is greater than or equal to the determination soak time TIMSKTh, the previous value ACFb of the fully-charged acceptance amount, which is the fully-charged acceptance amount ACF acquired through the execution of the previous fully-charging process, may be corrected using the soak correction amount α1 so that the previous value ACFb decreases, and the previous value ACFb subsequent to the decreasing correction may be calculated as the corrected fully-charged acceptance amount ACFbA. In this case, when the larger one of the corrected fully-charged acceptance amount ACFbA and the fully-charged acceptance amount ACF is greater than or equal to the threshold value ACFTh, the series of processes shown in FIG. 7 may be ended without executing the processes subsequent to step S36.

Additionally, when the processes subsequent to step S36 are not executed as described above, the processes of steps S61 to S66 shown in FIG. 15 may be executed.

In the first, second, third, and fifth embodiments, as long as it is possible to determine whether the lead-acid battery 13 is a liquid-type high-grade lead-acid battery, the determination as to whether the internal resistance IR of the lead-acid battery 13 is less than the determination resistance value IRTh may be omitted. That is, when the lead-acid battery 13 is not a liquid-type high-grade lead-acid battery, the identification as to whether the lead-acid battery 13 is a valve regulated high-grade lead-acid battery or a low-grade lead-acid battery does not have to be done.

The battery type identifying device 20, which corresponds to an example of the controller that executes the steps of the method for identifying the battery type, can be constructed by a device that includes a CPU and a ROM and executes software processing, but is not limited to this configuration. For example, at least part of the processes executed by the software in the above-illustrated embodiments may be executed by hardware circuits dedicated to executing these processes (such as ASIC). That is, the control device may be modified as long as it has any one of the following configurations (a) to (c). (a) A configuration including a processor that executes all of the above-described processes according to programs and a program storage device such as a ROM (including a non-transitory computer readable medium) that stores the programs. (b) A configuration including a processor and a program storage device that execute part of the above-described processes according to the programs and a dedicated hardware circuit that executes the remaining processes. (c) A configuration including a dedicated hardware circuit that executes all of the above-described processes. A plurality of software processing circuits each including a processor and a program storage device and a plurality of dedicated hardware circuits may be provided. That is, the above processes may be executed in any manner as long as the processes are executed by processing circuitry that includes at least one of a set of one or more software processing circuits and a set of one or more dedicated hardware circuits.

The technical ideas understood from the above-described embodiments and modifications will hereafter be described with their advantages.

A battery type identifying device that determines a type of an onboard lead-acid battery, the battery type identifying device including a voltage acquisition unit that acquires an open-circuit voltage of the lead-acid battery when the lead-acid battery has become fully charged and a determination unit that determines that the lead-acid battery is a valve regulated lead-acid battery when the open-circuit voltage of the acquired lead-acid battery is greater than or equal to a determination voltage.

The valve regulated lead-acid battery and the liquid-type lead-acid battery are different in the open-circuit voltage when the battery is fully charged. More specifically, the open-circuit voltage of the fully-charged valve regulated lead-acid battery is higher than the open-circuit voltage of the fully-charged liquid-type lead-acid battery. Thus, in the above-described configuration, the lead-acid battery is charged to the fully-charged state. When the state of the lead-acid battery is adjusted to the fully-charged state, the open-circuit voltage of the lead-acid battery is acquired. When the acquired open-circuit voltage is greater than or equal to the determination voltage, it is determined that the onboard lead-acid battery is a valve regulated lead-acid battery. Accordingly, it can be determined whether the valve regulated lead-acid battery is a valve regulated lead-acid battery.

In the battery type identifying device, the determination unit determines that the lead-acid battery is a liquid-type lead-acid battery when an internal resistance of the lead-acid battery is less than a determination resistance value and the open-circuit voltage of the lead-acid battery acquired by the voltage acquisition unit is less than the determination voltage.

In a case where the onboard lead-acid battery is a low-grade lead-acid battery, the open-circuit voltage when the low-grade lead-acid battery has become fully charged is not so high. That is, when the open-circuit voltage is low, it cannot be identified only from the open-circuit voltage whether the lead-acid battery is a liquid-type high-grade lead-acid battery or a low-grade lead-acid battery.

In the above-described configuration, when the internal resistance of the lead-acid battery is low and the open-circuit voltage of the fully-charged lead-acid battery is not large, the onboard lead-acid battery is determined as being a liquid-type high-grade lead-acid battery. Thus, when the open-circuit voltage of the fully-charged lead-acid battery is not large, it can be determined whether the onboard lead-acid battery is a liquid-type high-grade lead-acid battery by also using the internal resistance.

A method for identifying a battery type that determines a type of an onboard lead-acid battery, where the method causes a controller to execute a step that fully charges the lead-acid battery, a step that acquires an open-circuit voltage of the lead-acid battery when the lead-acid battery becomes fully charged, and a step that determines that the lead-acid battery is a valve regulated lead-acid battery when the open-circuit voltage of the acquired lead-acid battery is greater than or equal to a determination voltage.

In the method, the same advantage as that of the battery type identifying device can be gained by causing the controller to execute the steps.

DESCRIPTION OF THE REFERENCE NUMERALS

13) Lead-Acid Battery; 20, 30) Battery Type Identifying Device; 21, 31) Charging Processor; 22) Acceptance Amount Acquisition Unit; 23, 33) Determination Unit; 24) Fully-Charged Acceptance Amount Acquisition Unit; 25) Soak Time Acquisition Unit; 26) Fully-Charged Acceptance Amount Correction Unit; 28) Temperature Association Value Obtaining Unit; 29) Determination Prohibiting Processor; 32) Voltage Acquisition Unit

The invention claimed is:

1. A battery type identifying device that identifies a type of an onboard lead-acid battery, wherein a state of the lead-acid battery when a charge amount decreases by a given amount from a fully-charged state is referred to as a given state and an amount of the charge amount of the lead-acid battery increased through charging is referred to as an acceptance amount, the battery type identifying device comprising:
   a charging processor that executes a determination charging process that charges the lead-acid battery during a given time on condition that the state of the lead-acid battery has entered the given state due to a decrease in the charge amount from the fully-charged state;
   an acceptance amount acquisition unit that acquires the acceptance amount of the lead-acid battery during an execution period of the determination charging process; and
   a determination unit that determines whether the lead-acid battery is a liquid-type lead-acid battery using the acceptance amount acquired by the acceptance amount acquisition unit.

2. The battery type identifying device according to claim 1, wherein the determination unit determines that the lead-acid battery is a liquid-type lead-acid battery when the acceptance amount acquired by the acceptance amount acquisition unit is larger than a determination acceptance amount.

3. The battery type identifying device according to claim 2, wherein the determination unit determines that the lead-acid battery is a valve regulated lead-acid battery when an internal resistance of the lead-acid battery is less than a determination resistance value and the acceptance amount acquired by the acceptance amount acquisition unit is less than or equal to the determination acceptance amount.

4. The battery type identifying device according to claim 1, wherein
   the charging processor executes
      a fully-charging process that charges the lead-acid battery so that the lead-acid battery becomes fully charged when identifying the type of the lead-acid battery, and
      the determination charging process on condition that the lead-acid battery has entered the given state due to a decrease in the charge amount of the lead-acid battery subsequent to completion of the execution of the fully-charging process,
   the charge amount of the lead-acid battery when the charging processor starts the fully-charging process is referred to as an initial capacity,
   the acceptance amount acquisition unit acquires the initial capacity when the charging processor starts executing the fully-charging process to acquire, in association with the initial capacity, the acceptance amount of the lead-acid battery during a subsequent execution period of the determination charging process executed by the charging processor, and
   when multiple pieces of information including the initial capacity and the acceptance amount associated with the initial capacity are acquired, the determination unit determines whether the lead-acid battery is a liquid-type lead-acid battery according to whether an inclination of an approximate straight line is positive or negative, the approximate straight line indicating association between the initial capacity and the acceptance amount and being calculated using the multiple pieces of information.

5. The battery type identifying device according to claim 1, wherein the charging processor executes
   a fully-charging process that charges the lead-acid battery so that the lead-acid battery becomes fully charged when identifying the type of the lead-acid battery, and
   the determination charging process on condition that the lead-acid battery has entered the given state due to a decrease in the charge amount of the lead-acid battery subsequent to completion of the execution of the fully-charging process,
   the battery type identifying device comprises a fully-charged acceptance amount acquisition unit that acquires the acceptance amount of the lead-acid battery as a fully-charged acceptance amount during the execution period of the fully-charging process, and
   the determination unit determines whether the lead-acid battery is a liquid-type lead-acid battery when the fully-charged acceptance amount acquired by the fully-charged acceptance amount acquisition unit is less than or equal to a threshold value and does not make the determination when the fully-charged acceptance amount is larger than the threshold value.

6. The battery type identifying device according to claim 5, comprising a soak time acquisition unit that acquires a soak time in a case where the fully-charging process was executed by the charging processor during a vehicle operation prior to a current vehicle operation, the soak time being an elapsed time from an end of a vehicle operation when the fully-charging process in a previous time was executed to a beginning of the current vehicle operation,
   wherein the determination unit does not determine whether the lead-acid battery is a liquid-type lead-acid battery when the soak time acquired by the soak time acquisition unit is less than a determination soak time.

7. The battery type identifying device according to claim 1, wherein the charging processor executes
   a fully-charging process that charges the lead-acid battery so that the lead-acid battery becomes fully charged when identifying the type of the lead-acid battery, and
   the determination charging process on condition that the lead-acid battery has entered the given state due to a decrease in the charge amount of the lead-acid battery subsequent to completion of the execution of the fully-charging process,
   the battery type identifying device comprises:
   a fully-charged acceptance amount acquisition unit that acquires, as a fully-charged acceptance amount, the acceptance amount of the lead-acid battery during an execution period of the fully-charging process;
   a soak time acquisition unit that acquires a soak time in a case where the fully-charging process was executed by the charging processor during a vehicle operation prior to a current vehicle operation, the soak time being an elapsed time from an end of a vehicle operation when the fully-charging process in a previous time was executed to a beginning of the current vehicle operation; and
   a fully-charged acceptance amount correction unit, wherein in a case where the fully-charged acceptance amount acquired by the fully-charged acceptance amount acquisition unit through the execution of the fully-charging process in the previous time is referred to as a previous value of the fully-charged acceptance amount, when the soak time acquired by the soak time acquisition unit is greater than or equal to a determination soak time, the fully-charged acceptance amount correction unit corrects the previous value of the fully-charged acceptance amount so that the previous value is decreased and calculates the previous value subsequent to the decreasing correction as a corrected fully-charged acceptance amount, wherein in a case in which the fully-charged acceptance amount acquired by the fully-charged acceptance amount acquisition unit through the execution of the fully-charging process in the current vehicle operation is set as a latest value of the fully-charged acceptance amount, the determination unit determines whether the lead-acid battery is a liquid-type lead-acid battery when a larger one of the latest value of the fully-charged acceptance amount and the corrected fully-charged acceptance amount is less than or equal to a threshold value and does not make the determination when the larger one is larger than the threshold value.

8. The battery type identifying device according to claim 7, comprising a temperature association value obtaining unit that obtains a temperature association value that increases as a temperature of the lead-acid battery increases, wherein the fully-charged acceptance amount correction unit corrects the previous value of the fully-charged acceptance amount so that the previous value decreases as the temperature association value obtained by the temperature association value obtaining unit increases, and calculates the corrected previous value as the corrected fully-charged acceptance amount.

9. The battery type identifying device according to claim 7, comprising a determination prohibition unit that prohibits a determination as to whether the lead-acid battery mounted on a vehicle is a liquid-type lead-acid battery during a period until the lead-acid battery is exchanged when the corrected fully-charged acceptance amount is greater than or equal to a determination prohibition threshold value that is larger than the threshold value in a case where the corrected fully-charged acceptance amount is larger than the latest value of the fully-charged acceptance amount.

10. The battery type identifying device according to claim 7, comprising:

a temperature association value obtaining unit that obtains a temperature association value that increases as a temperature of the lead-acid battery increases; and a determination prohibition unit that corrects the latest value of the fully-charged acceptance amount so that the latest value decreases as the temperature association value obtained by the temperature association value obtaining unit increases when the latest value of the fully-charged acceptance amount is greater than or equal to the corrected fully-charged acceptance amount and prohibits a determination as to whether the lead-acid battery mounted on a vehicle is a liquid-type lead-acid battery during a period until the lead-acid battery is exchanged when the corrected latest value is greater than or equal to a determination prohibition threshold value that is larger than the threshold value.

11. The battery type identifying device according to claim 1, wherein the determination unit determines that the lead-acid battery is a low-grade lead-acid battery when an internal resistance of the lead-acid battery is greater than or equal to a determination resistance value.

12. A method for identifying a battery type identifying a type of an onboard lead-acid battery, wherein an amount of the charge amount of the lead-acid battery increased through charging of the lead-acid battery is referred to as an acceptance amount, the method comprising:

stopping, by a controller, charging of the lead-acid battery until the state of the lead-acid battery has entered a given state, the given state being a state of the lead-acid battery when a charge amount decreases by a given amount from a fully-charged state;

executing, by the controller, a determination charging process that charges the lead-acid battery during a given time on condition that the lead-acid battery has entered the given state and acquires the acceptance amount of the lead-acid battery during an execution period of the determination charging process; and determining, by the controller, whether the lead-acid battery is a liquid-type lead-acid battery using the acceptance amount acquired by the step.

\* \* \* \* \*